United States Patent
Hutchison et al.

(10) Patent No.: US 7,330,743 B2
(45) Date of Patent: *Feb. 12, 2008

(54) CASING

(75) Inventors: Mark Hutchison, Headley (GB);
Michael Hague, Reading (GB)

(73) Assignee: Vertu Limited, London (GB)

( * ) Notice: Subject to any disclaimer, the term of this patent is extended or adjusted under 35 U.S.C. 154(b) by 452 days.

This patent is subject to a terminal disclaimer.

(21) Appl. No.: 10/250,399

(22) PCT Filed: Dec. 21, 2001

(86) PCT No.: PCT/GB01/05739

§ 371 (c)(1),
(2), (4) Date: Dec. 24, 2003

(87) PCT Pub. No.: WO02/054721

PCT Pub. Date: Jul. 11, 2002

(65) Prior Publication Data

US 2004/0087333 A1    May 6, 2004

(30) Foreign Application Priority Data

Dec. 29, 2000  (GB) .................. 0031790.9
Jun. 29, 2001  (GB) .................. 0116000.1

(51) Int. Cl.
*H04M 1/00*     (2006.01)

(52) U.S. Cl. .......................... 455/575.8; 455/550.1; 455/575.1; 455/90.3; 455/566; 361/680; D14/247

(58) Field of Classification Search ............ 455/550.1, 455/575.1, 575.8, 90.3, 425; 345/168; 361/679, 361/683, 680; D14/247–248, 137–138; 379/433.01, 379/433.04, 433.07, 433.11
See application file for complete search history.

(56) References Cited

U.S. PATENT DOCUMENTS

| 5,235,636 | A  |   | 8/1993  | Takagi et al. ............... 379/368 |
| 5,768,370 | A  |   | 6/1998  | Maatta et al. ............... 379/433 |
| 5,982,881 | A  | * | 11/1999 | Mischenko ............ 379/433.11 |
| D455,736  | S  | * | 4/2002  | Vuolteenaho et al. ...... D14/247 |
| D455,739  | S  | * | 4/2002  | Vuolteenaho et al. ...... D14/248 |
| 6,421,234 | B1 | * | 7/2002  | Ricks et al. ................ 361/683 |
| D462,344  | S  | * | 9/2002  | Nuovo ..................... D14/247 |
| 6,463,263 | B1 | * | 10/2002 | Feilner et al. ........... 455/550.1 |
| 6,728,519 | B1 | * | 4/2004  | Okuda ..................... 455/575.1 |
| 6,771,981 | B1 | * | 8/2004  | Zalewski et al. ......... 455/575.1 |
| 6,810,238 | B1 | * | 10/2004 | Deeds et al. ............... 455/90.1 |
| 6,842,633 | B1 | * | 1/2005  | Deo et al. ................ 455/575.8 |
| 7,006,349 | B2 | * | 2/2006  | Nuovo et al. ............... 361/679 |

(Continued)

FOREIGN PATENT DOCUMENTS

CH            682364G A3    9/1993

(Continued)

*Primary Examiner*—Steve M. D'Agosta
*Assistant Examiner*—Kamran Afshar
(74) *Attorney, Agent, or Firm*—Harrington & Smith, PC

(57) ABSTRACT

A casing for a portable communication device having an operating face comprising a fragile input region providing recesses for operation of respective user input elements and a protection arrangement protruding beyond the fragile input region having an external profile that provides a plurality of contact points defining a contact plane such that when placed face downwards on a generally planar surface, the fragile region is spaced therefrom and impulses received on contact between the generally planar surface and the operating face are substantially dissipated away from the fragile region.

18 Claims, 19 Drawing Sheets

U.S. PATENT DOCUMENTS

| | | | |
|---|---|---|---|
| 2004/0096054 A1* | 5/2004 | Nuovo | 379/433.01 |
| 2004/0102210 A1* | 5/2004 | Hutchison et al. | 455/550.1 |
| 2004/0102230 A1* | 5/2004 | Nuovo | 455/575.1 |
| 2004/0102231 A1* | 5/2004 | Nuovo et al. | 455/575.1 |
| 2004/0102232 A1* | 5/2004 | Nuovo | 455/575.1 |
| 2004/0109560 A1* | 6/2004 | Nuovo et al. | 455/575.1 |
| 2004/0114318 A1* | 6/2004 | Nuovo et al. | 361/683 |
| 2004/0114754 A1* | 6/2004 | Nuovo | 379/428.01 |
| 2004/0132504 A1* | 7/2004 | Hague et al. | 455/575.1 |
| 2004/0147294 A1* | 7/2004 | Nuovo | 455/575.1 |
| 2005/0101356 A1* | 5/2005 | Hutchison | 455/566 |

FOREIGN PATENT DOCUMENTS

| | | | |
|---|---|---|---|
| CH | 688982 | A5 | 6/1998 |
| DE | 2747536 | A1 | 4/1979 |
| EP | 0878942 | A2 | 11/1998 |
| EP | 1157799 | A1 | 11/2001 |
| GB | 2192084 | A | 12/1987 |
| GB | 2322501 | A | 8/1998 |
| GB | 2331888 | A | 6/1999 |
| JP | 3-86654 | | 9/1991 |
| JP | 8274851 | A | 10/1996 |
| JP | 1998-063394 | | 3/1998 |
| JP | 3054915 | | 10/1998 |
| JP | 11196162 | A | 7/1999 |
| JP | 2000-174874 | | 6/2000 |
| JP | 2001215885 | A | 8/2001 |
| WO | WO-92/01250 | A1 | 1/1992 |
| WO | WO-00/56040 | A1 | 9/2000 |
| WO | WO-02/49323 | A1 | 6/2002 |

* cited by examiner

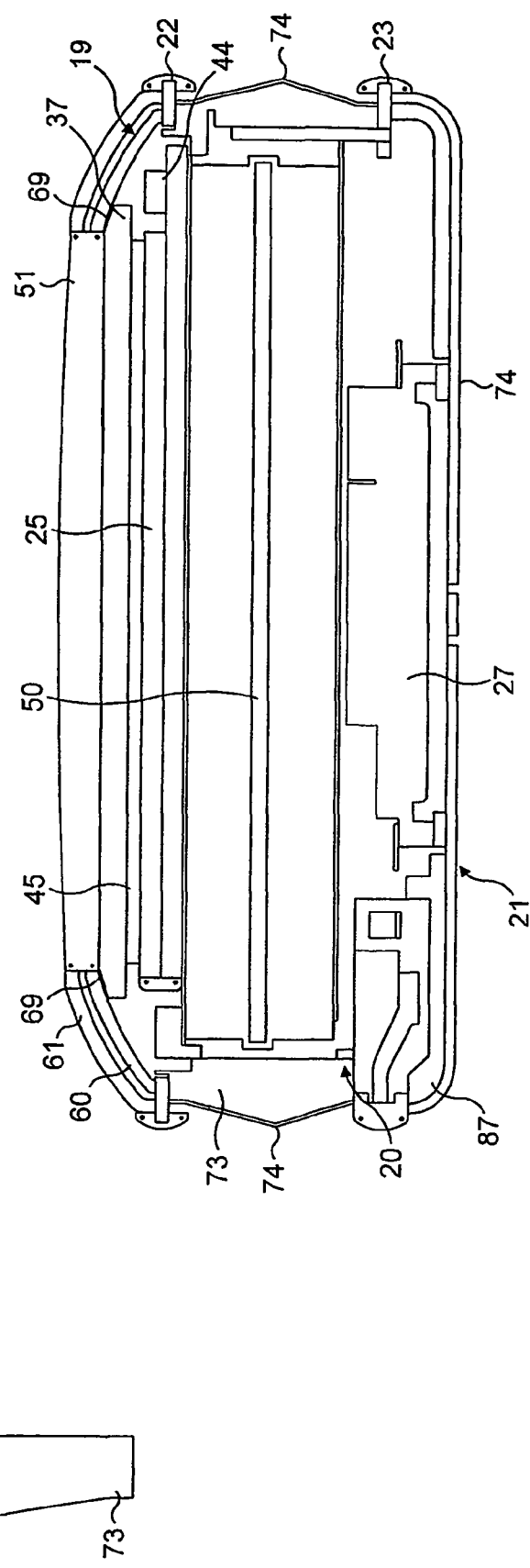
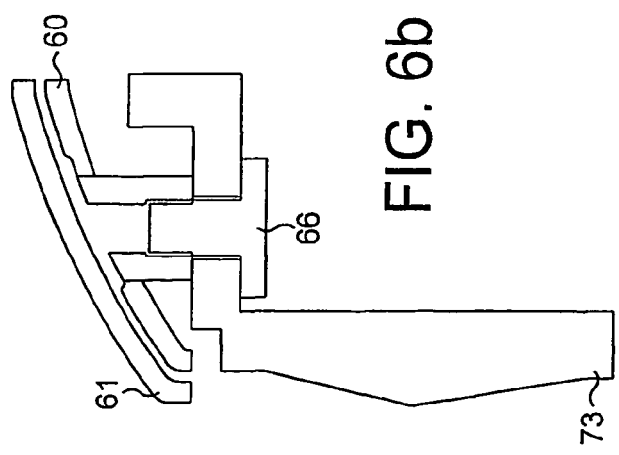
FIG. 6a
FIG. 6b

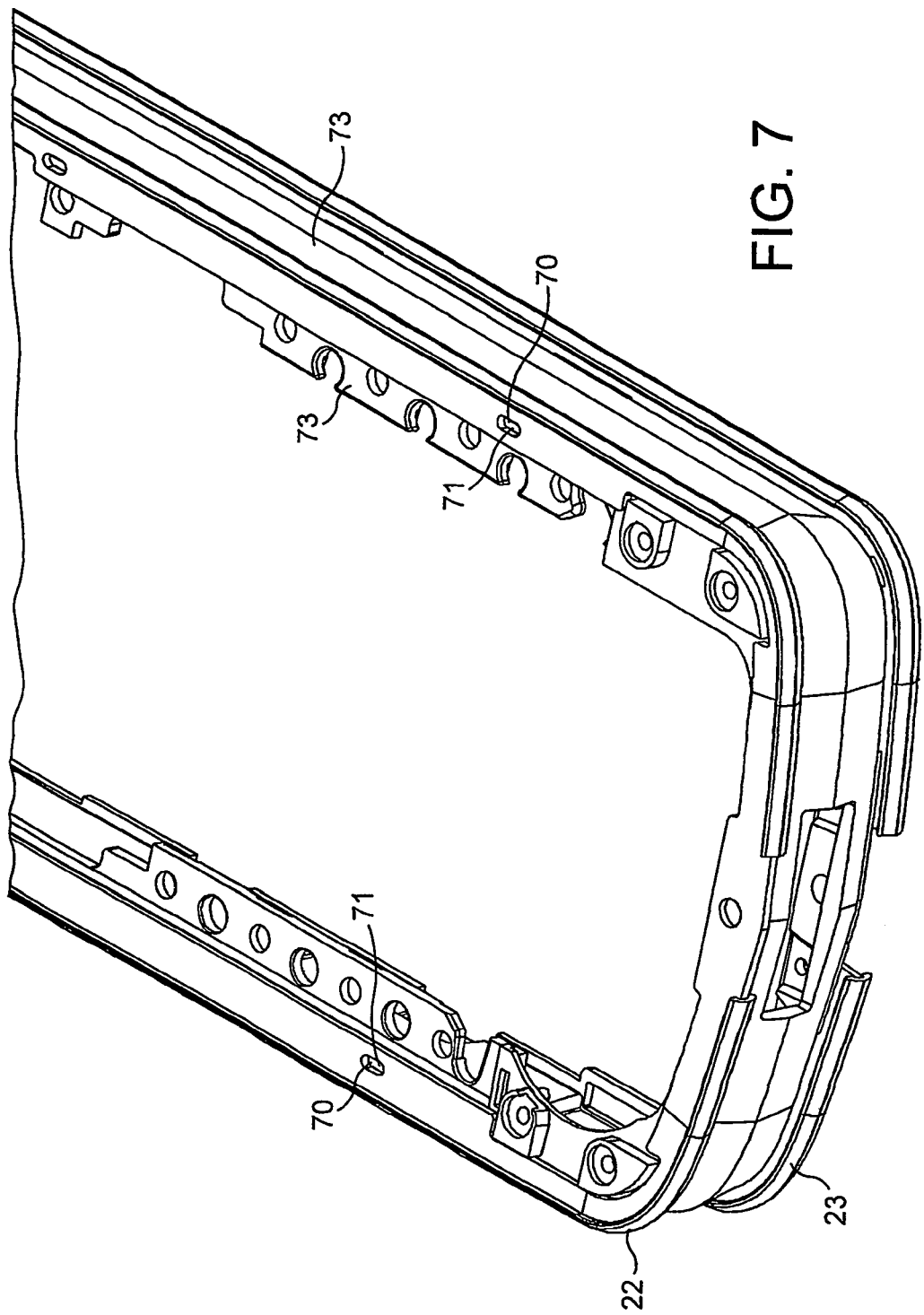

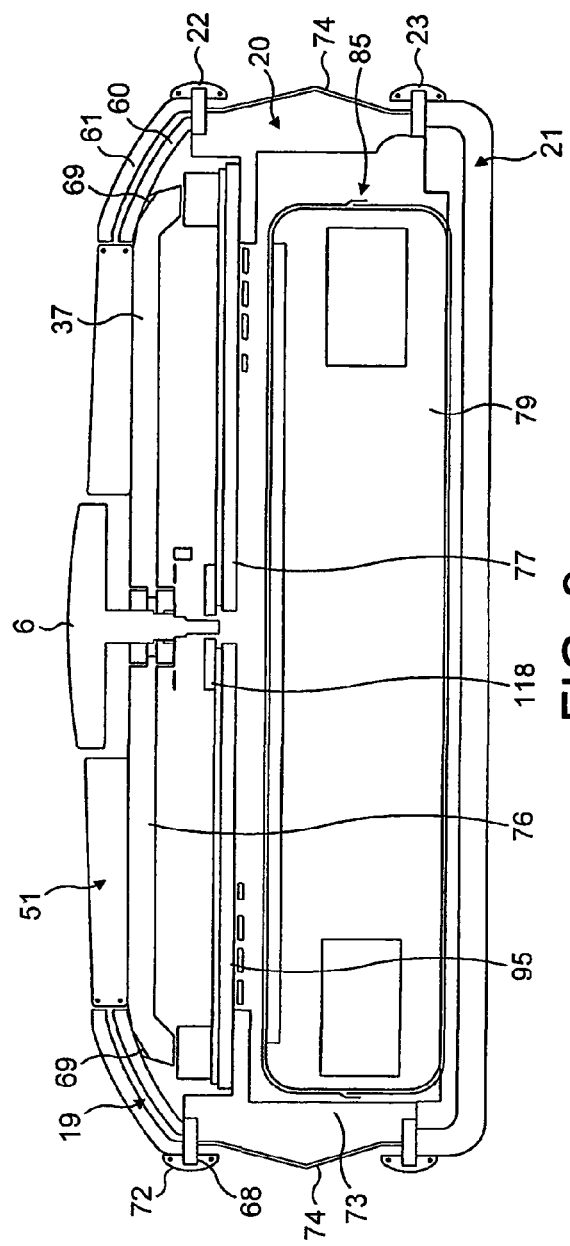
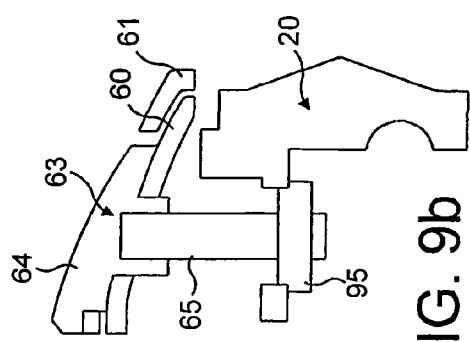
FIG. 9a
FIG. 9b

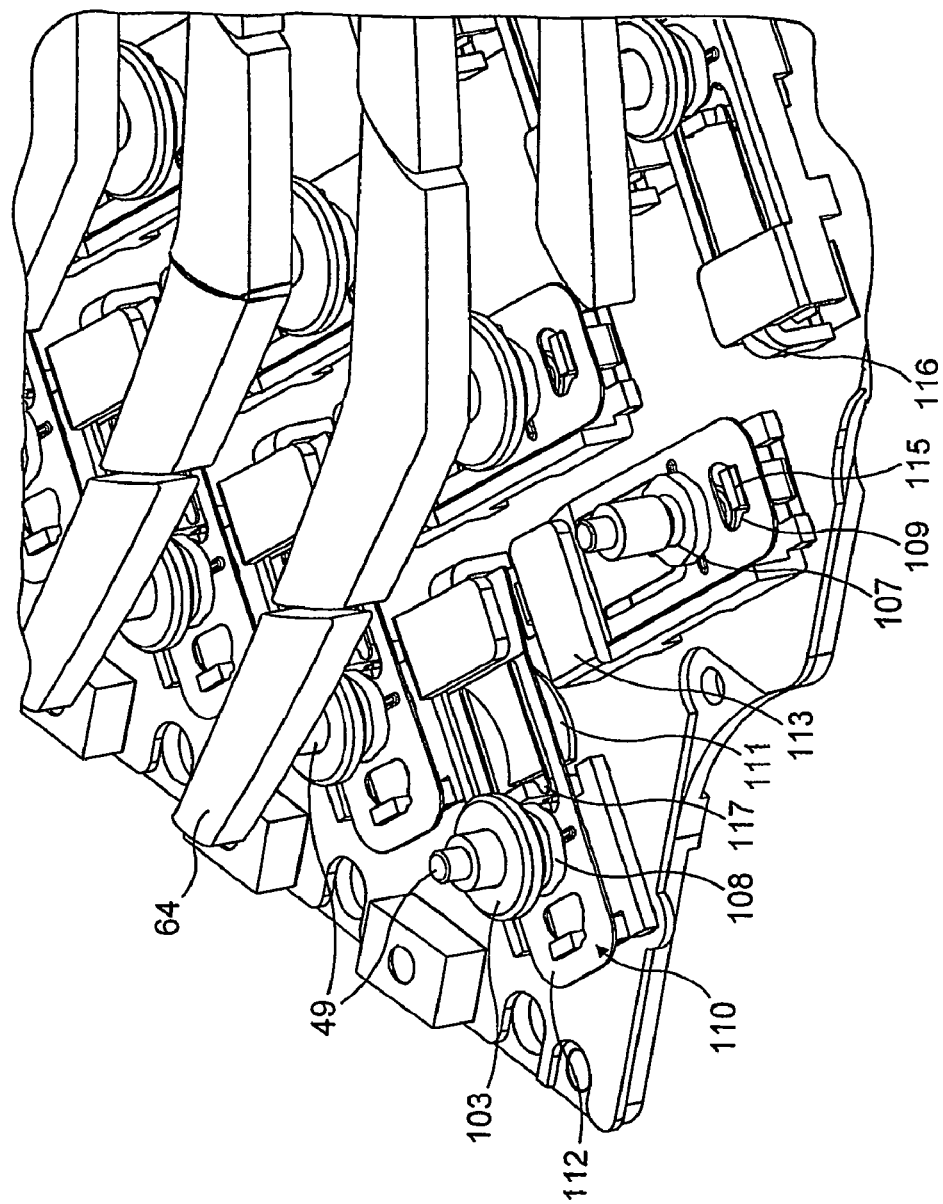

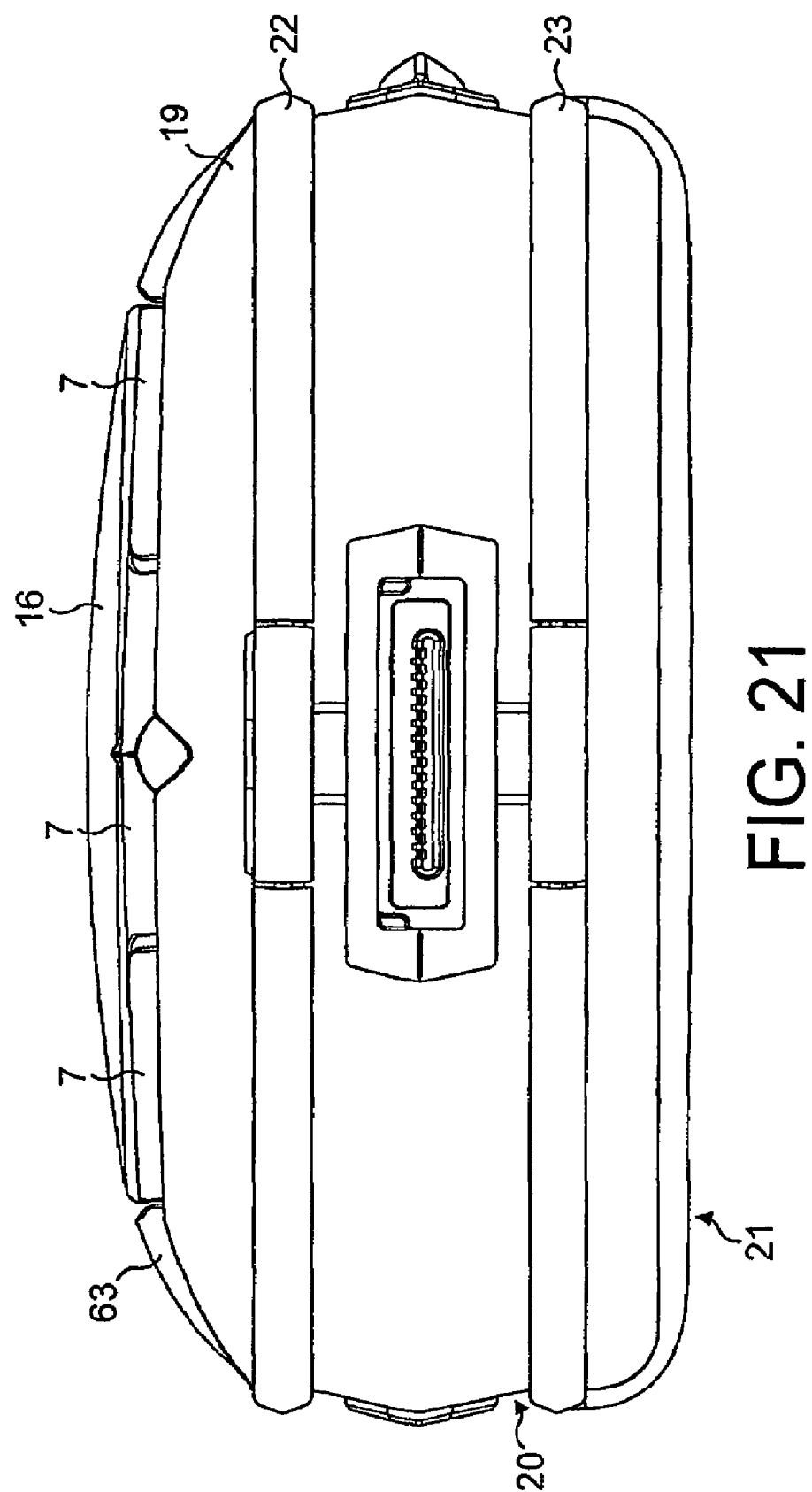

CASING

FIELD OF THE INVENTION

This application claims foreign priority benefit of application no.: 0031790.90 filed Dec. 29, 2000 and Application no.: 0116000.1 filed on Jun. 29, 2001.

The invention relates to personal communications devices and housings for such devices.

BACKGROUND OF THE INVENTION

Over recent years, personal communications devices ranging from mobile phones to electronic diaries and beyond have moved from being elite items to everyday tools. In all these years, however, the design criteria for the casing for the pieces of equipment have not really changed.

Communications devices of this type have casings designed with ease of assembly, durability, and cost, amongst other things in mind. From the first, casings have typically been formed from moulded parts as these lend themselves particularly to automated manufacture and can be easily automatically clipped together for assembly. The plastic materials used are also relatively flexible and consequently resilient against the knocks and drops that will inevitably be encountered by a highly utilised personal portable device. The design criteria have led to similar types of casing being used for all such devices.

In accordance with an aspect of the present invention there is provided a casing for a portable communication device having an operating face comprising a fragile input region providing recesses for operation of respective user input elements and a protection arrangement protruding beyond the fragile input region having an external profile that provides a plurality of contact points defining a contact plane such that when placed face downwards on a generally planar surface, the fragile region is spaced therefrom and impulses received on contact between the generally planar surface and the face are substantially dissipated away from the fragile region.

SUMMARY OF THE INVENTION

The present invention allows the design criteria for the casing of a handheld device to be relaxed and, in particular, different materials to be used. When constrained by conventional thinking, the casing is made from conventional materials. These are generally robust materials in order not to be sensitive to knocks and other impulses. The invention allows more fragile materials to be used. The term fragile, in the context of this application is intended to include materials that are less robust and that perhaps are brittle or liable to damage, in particular shattering, if dropped.

The casing may be a conventional one part casing or a clam shell, or other two or more part arrangement, where the user input elements or keys may be located on a different face to a display. In such two part arrangements generally respective casing portions are fixed such that one is movable relative to the other. The movement may be rotational or lateral.

As stated above, the invention allows the opportunity for more brittle materials to provide a face of the casing. When the surface layer is brittle or easily catastrophically damaged, the manner in which the different elements interplay is important. It may seem strange to select a material that has brittleness as a characteristic for a durable item but by allowing relatively brittle materials to provide a surface layer of such a device, materials including precious stones such as sapphire or diamond could be used. These have aesthetic as well as functional advantages. Less costly options could also include materials such as glass or one of the huge number of ceramic materials that are available. Opening up the field from which materials of the casing and in particular the front surface can be selected allows many new design choices to be made.

By providing protection arrangements according to aspects of the invention, areas of the casing can be protected making it possible to utilise the unconventional materials mentioned above, and others, in designing casings for portable communications devices. This is achieved by directing the forces resulting from impacts through more robust regions of the phone, consequently protecting those more vulnerable areas. This may be achieved by providing the protection arrangement to channel forces into more robust elements of the casing such as a plastic frame or core.

The protection arrangement may be provided by a bezel or other component surrounding the fragile region which may be a brittle surface layer which may be supported by a substrate. The bezel may be connected to the substrate so as not to transfer impulses to the brittle surface layer. By separating the fragile region from the protection arrangement unwanted impulses are more easily prevented from transferring from the contact points to the fragile region. A suitable structure for mounting a fragile region in a housing is described in greater detail in co-pending application GB 0031790.9. A copy is filed with this application. The contact points may be provided by individual elements protruding beyond the fragile region and/or beyond the bezel that provide the additional function of connecting the bezel to the body of the phone. The contact points may be disposed around the periphery of the operating face and may include a projection on the chin of the casing and/or raised portion proximate the earpiece.

In prior art key guards or covers the critical factor under consideration for operation of key protection is whether or not the key is actuated. The slide, the flip and the keyguard all provide a solution to the same problem. By providing an electronic key guard, any inadvertent key actuations are in effect ignored by the handset. By providing a cover the key actuations are ostensibly prevented. The efficacy of such solutions depends to a greater or lesser extent on the properties of the materials from which the covers are fabricated.

None of these solutions provide a solution that protects the physical interaction between the mechanism of the key and the operating face allowing more design options to be available. With increased miniaturisation on phones the design requirements for key arrays are ever more stringent, and the difficulties in providing reproducibly actuable keys more pronounced.

One way in which problems of this type may be ameliorated is through the use of distinct keys. That is keys which are physically and functionally separate from the other keys, such that the operation of the one key cannot affect the operation of any other key. For such keys it is preferably that each key has a separate switching element and separate coupling means, such as a shaft guided by two spaced apart bearings. For key mechanisms of the type described above see the applicants co-pending application no GB 0031798.2.

For such key arrangements, the shafts and bearings are unusually vulnerable to sharp impulses such as those that may occur if the keys presses quickly and with force as it may be if dropped, particularly if the handset is dropped face downward on a hard surface. Protruding keys would then be depressed and may result in a sharp impulse being passed to both the shaft and the bearing. An electronic key guard would not protect against this type of impact. Key covers have not been designed with the physical protection of the keys in mind and may not always be practical or desirable. The present invention provides an alternative solution to this newly realised problem.

In an embodiment of the invention the casing forms part of a portable communications device having at least one key having an outer face protruding from the plane of the operating face in a rest position and arranged to travel to a contact position located inward of the rest position. The protection arrangement defines the contact plane in the locality of the at least one key such that when placed on a generally flat surface, the resulting travel of the at least one key is restricted.

The key may be a distinct key having a shaft travelling in a direction defined by outer and inner bearings. If the key comes to an abrupt stop when its underside abuts a bearing surface on the fragile region defining the contact position, by restricting the travel of the key when the device is dropped face downward, the potentially brittle region is protected against shocks resulting from the drop. Without such embodiments of the present invention, the shock of such an impact would be absorbed through the bearing surface and dissipated in the fragile region. This could potentially shatter such a casing element.

The bearing surface may be provided by a bearing located in an aperture in the fragile region of the handset. The bearing may itself be made from a fragile material. The projection arrangement may then be specifically arranged to direct impulses away from the bearings by, for example, dissipating energy to more robust elements of the device.

In embodiments of the present invention the protection arrangement comprises a pair of projections flanking a key or at either end of a row of keys. This provides a local contact plane in the vicinity of the key that protects against impact between the key and fragile region. If only a single travelling key is a potential risk to a fragile operating face, a local contact plane may be all that is necessary to protect the fragile surface in the vicinity of the key. As an alternative, embodiments of the invention are equally applicable for arrays of such keys that are perhaps arranged in rows where the projection arrangement comprises a respective pair of projections flanking each row of keys.

BRIEF DESCRIPTION OF THE DRAWINGS

Embodiments of the invention will now be described in more detail with reference to FIGS. 1 to 21 of the accompanying drawings of which:

FIGS. 6a and 6b are sections through the communication device of FIG. 1 in the display region;

FIG. 7 is a perspective view of a side frame element and located rails for constructing a casing

FIGS. 9a and 9b are sections through the communication device of FIG. 1 in the battery region;

FIG. 18 illustrates some of the keys illustrated in FIG. 17, with the key tips removed;

FIG. 21 is a bottom plan view of the device of FIG. 1 (with the chin face protector omitted).

DETAILED DESCRIPTION

Figure 1:
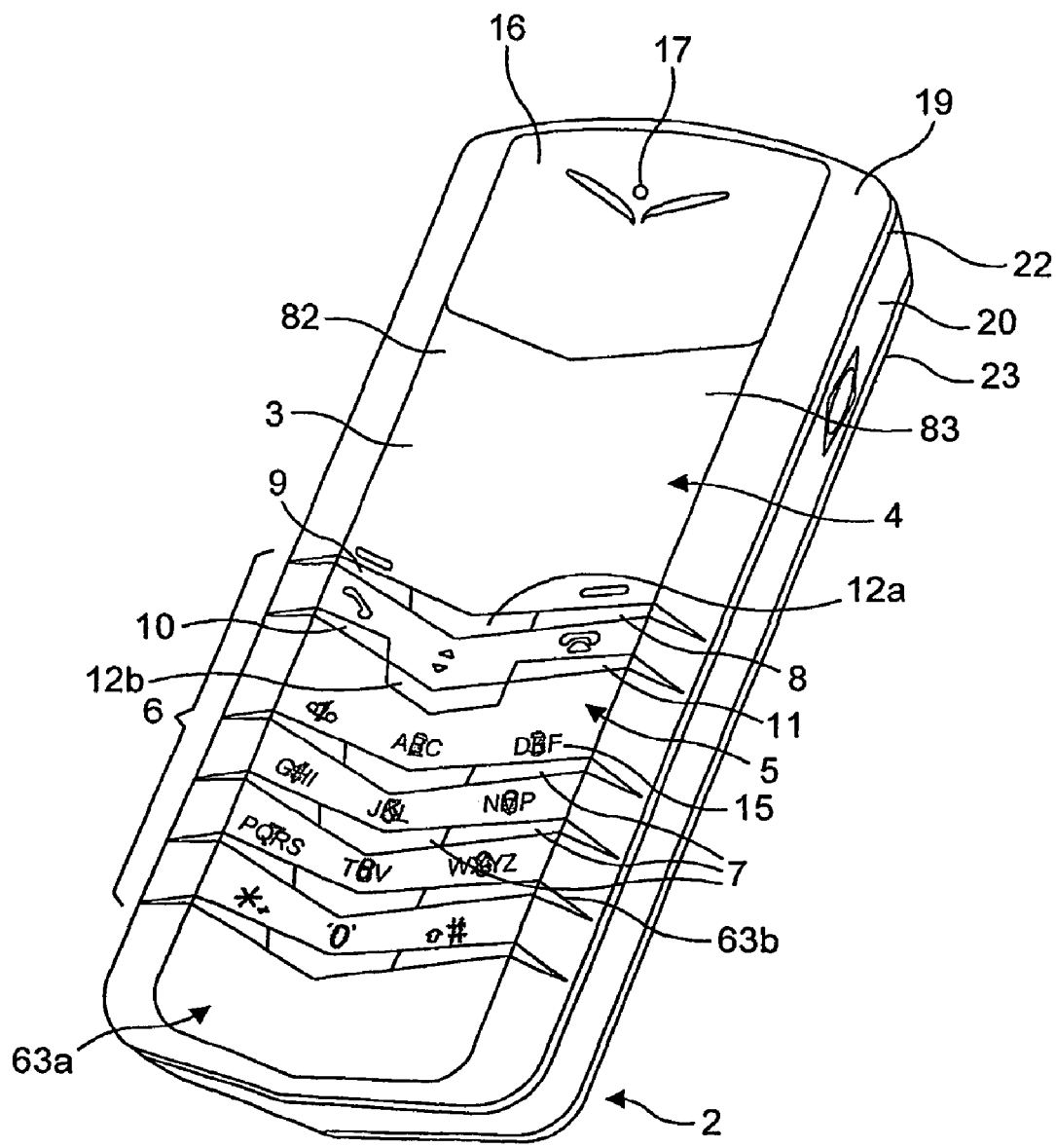
FIG. 1 is a perspective view of a communication device showing one embodiment of the invention.
Figure 2:
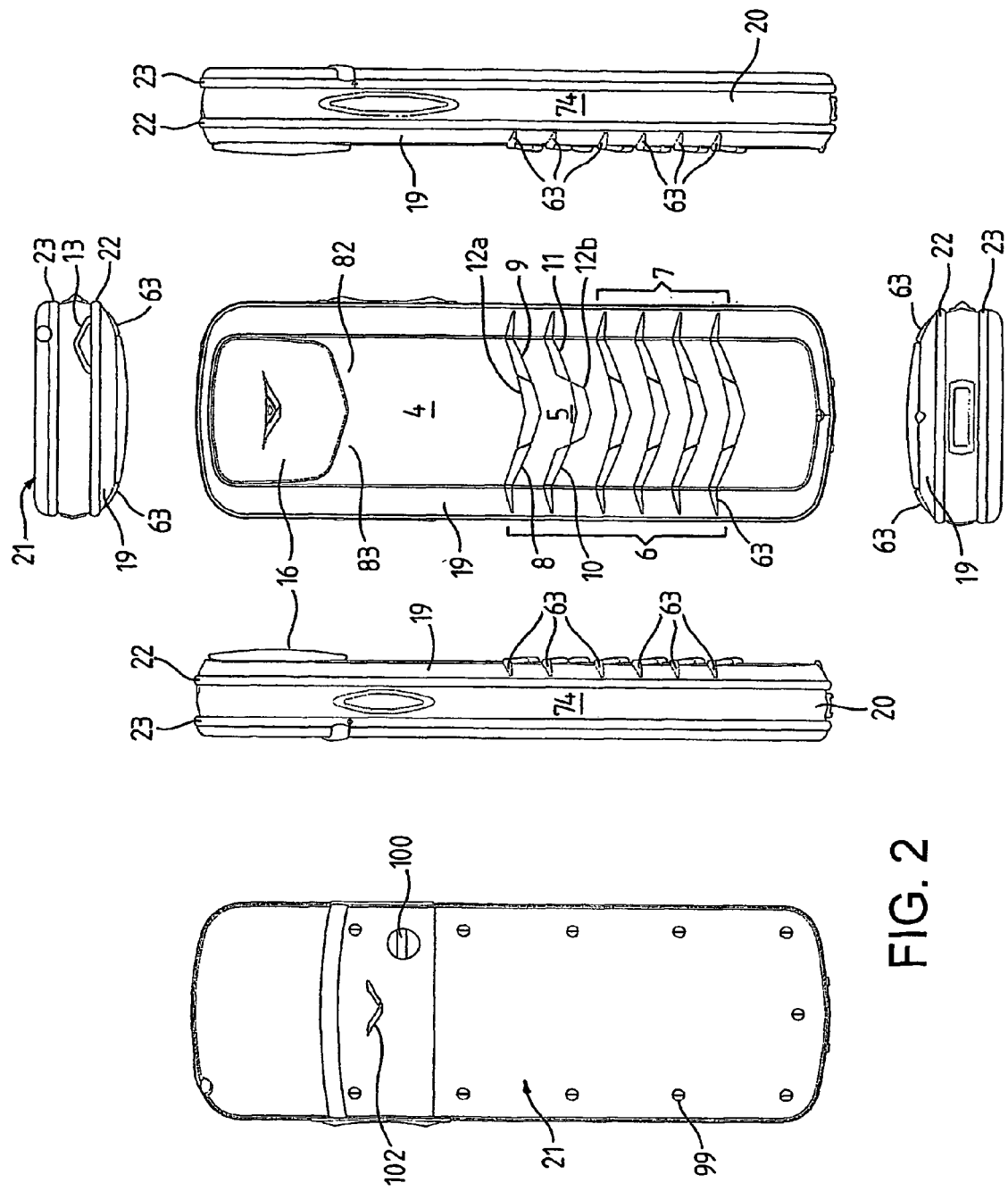
FIG. 2 shows front, rear, sides and top views of the communication device of FIG. 1.

The embodiment illustrated in FIG. 1 is a handheld communication device 1 with a precious retainable casing 2. The casing 2 of the device has been designed to be customisable to individual taste with precious materials. To enable individual devices to be created, the number of external parts that the casing is formed from is relatively large in contrast to existing communication devices.

The casing 2 has an optically permeable front face 3 providing a seamless transition from a display region 4 to an input region 5 that includes a key array 6. The key array 6 includes a first group of alphanumeric keys 7, for entering telephone numbers, writing text messages (SMS), writing names (associated with phone numbers), etc. Each of the twelve alphanumeric keys 7 is provided with a figure "0-9" or a sign "#" or "*", respectively. In an alpha mode each key is associated with a number of letters and special signs used in text editing.

The key array 6 additionally comprises two soft keys 8, 9, two call handling keys 10, 11, two scroll keys 12, and an on/off key 13.

The functionality of the soft keys 8, 9 may depend on the state of the communication device and position within the menu accessed using the scroll keys 12. The current functionality of the soft keys 8, 9 can be shown in separate fields in the display region 4 just above the respective keys 8, 9.

The two call handling keys 10, 11 are used for establishing a call or a conference call, terminating a call or rejecting an incoming call.

The two direction keys or scroll keys 12, in the handset illustrated are placed centrally on the front surface of the communication device between the display region 4 and the group of alphanumeric keys 7 perform a scrolling function.

The seamless face 3 is formed from an optically seamless light guide 14 providing light to illuminate the display region 4 and key legends 15 located on the light guide 14 and associated with individual keys of the key array 6.

The front face 3 is overlaid with a pillow 16 providing apertures 17 to channel sound from a loud speaker 18 and providing an appropriate feel for an element of the device that will be located close to the user's ear. The front face 3 is surrounded by a bezel 19 that can be made from a precious metal.

This acts to protect the edges of the light guide 14 and can help in some embodiments in securing the elements of the casing 2 together.

The keys of the key array in this particular embodiment are arranged to provide particular sensory guidance to the user. Aspects of the design also allow the light guide 14 to be made from a wide range of materials including those that are brittle and so need to be carefully handled and protected from shattering.

The casing 2 is formed from the front face 3 surrounded by the bezel 19, a side frame 20 and a back cover 21. The interface between the side frame 20 and the bezel 19 and the side frame 20 and the rear cover 21 are shielded by rails 22, 23 in this embodiment. The rails 22, 23 hide raw edges from view and exposure to ensure that the device 1 is both long lasting and elegant. The construction of the casing 2 enables the casing 2 to be opened with ease to update the engine 24 inside when desired. The casing 2 is also designed to allow the device to accommodate different sized and shaped engines 24, which may be necessary through its life.

Other elements of the design will be discussed in greater detail with reference to the later drawings. By way of introduction, the device will be briefly discussed with reference to its functional elements.

Figure 3:
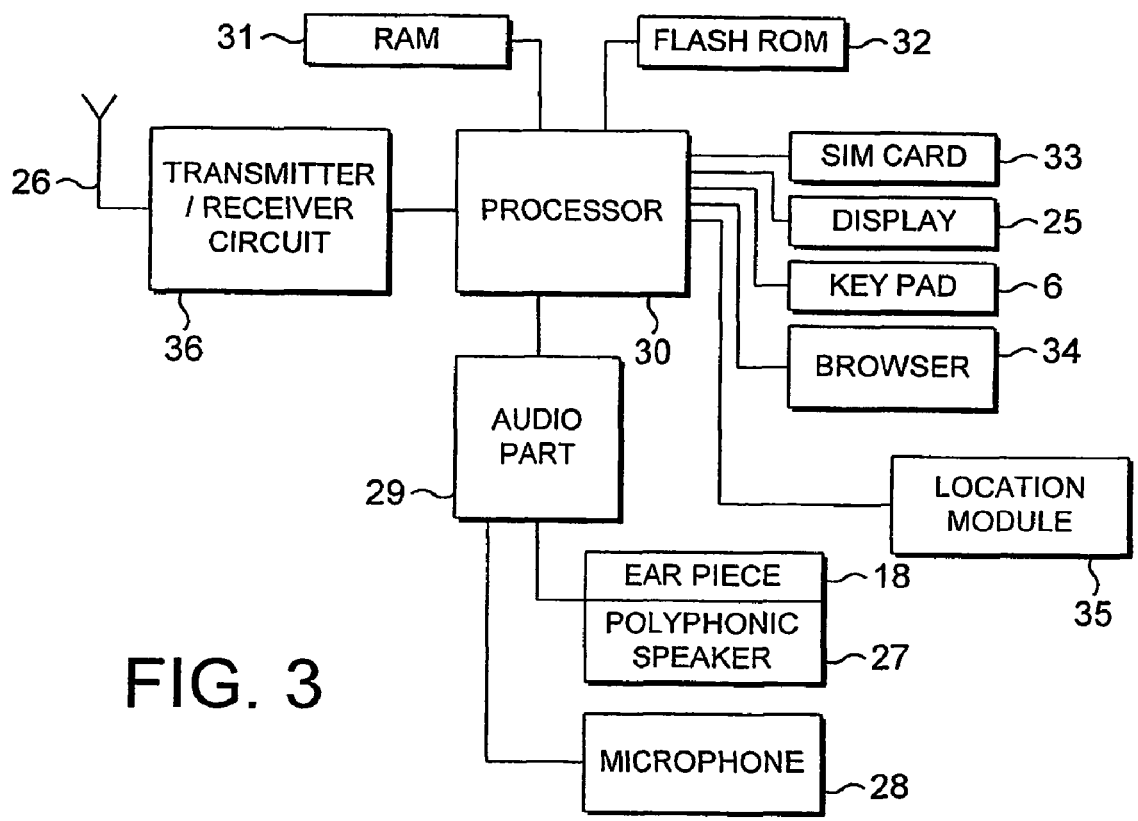
FIG. 3 is a schematic representation of a communication device suitable for embodiments of the present invention.

The communication device 1, includes the key array 6, a display 25, an antenna 26, an ear piece speaker 18, a polyphonic speaker 27, and a microphone 28. The communication device 1 is adapted for communication via a wireless telecommunication network, e.g. a wireless network. However, the communication device could also have been designed for a cordless network. FIG. 3 shows schematically and functionally elements of the communication device 1. The microphone 28 records the user's speech, and the analogue signals formed thereby are A/D converted by an A/D converter before the speech is encoded in an audio part 29. The encoded speech signal is transferred to processor 30. The processor 30 may support software in the phone. The processor 30 also forms the interface to peripheral units of the apparatus. These may include a Random Access Memory (RAM) 31 and a Flash Read Only Memory (ROM) 32, a SIM card 33, the display 25, and the key array 6, and perhaps a browser application 34, and a location module 35.

The browser application 34 can be used to request and receive information from the Internet. The location module 35 enables the terminal 1 to determine its current position.

The processor 30 communicates with a transceiver 36, e.g. a circuit, which is adapted to send and receive messages in a telecommunication network. The telecommunications network may be a GSM network, but the invention may also be applied in connection with other networks, such as other kinds of wireless networks and various forms of cordless phone systems or in dual band phones accessing sets of these systems or networks. The audio part 29 speech-decodes the signal, which is transferred from the processor 30 to the earpiece 18 via a D/A converter.

As discussed above, the front face 3 is optically permeable and acts as a light guide. The seamless light guide, passing light over the display region 4 as well as providing light to illuminate the key legends 15 reduces the number of lighting elements required to illuminate the device and provides a seamless transition from one area of the front of the device to another. By using this technique for delivering light and also allowing the light guide 14 to form the front surface of the device 1 as in the embodiment disclosed, the device is visually striking, there being no visible transition from the display region 4 to the input region 5 where the key array 6 is located.

The embodiment illustrated in FIG. 1 has a light permeable front face 3 that can be formed from sapphire or a similar precious stone. As soon as a mineral such as sapphire is used in place of other more flexible light permeable materials such as plastics, additional problems are introduced associated with the characteristics of the material. In designing a durable device having, for example, a brittle material for a front piece 3 there are many difficulties. In one manifestation of the embodiment illustrated in FIGS. 1, 2 and 4 to 6, the light guide 14 is an optically seamless composite layer. As can be seen most clearly in FIG. 4, a plastics layer 37 that may be formed from Perspex or other transparent and/or translucent materials runs the entire length of the front face 3. There is a cut-out 38 for accommodating the ear piece speaker 18 that is optimised for use close to the ear. There is another cut-out accommodating a light pipe diffuser 39. This is located under the pillow 16 and extends across the width of the device 1. By placing the light pipe 39 under the pillow 16, a bright area on the front face is avoided and the light visible in the light guide will be diffused. LEDs 40, 41 are located at each side of the device at each end of the pipe 39. Light from the LEDs 40, 41 is channelled through the pipe 39 and diffused. The light pipe 39 in this embodiment, is coated with reflective material so that light is channelled through the surface 42 that runs along the top of the LCD display 25. Embodiments without the coating provide some of the advantages. The diffused light is accordingly channelled into and along the major axis of the light guide 14 to provide substantially uniform lighting for the LCD 25.

Figure 15:
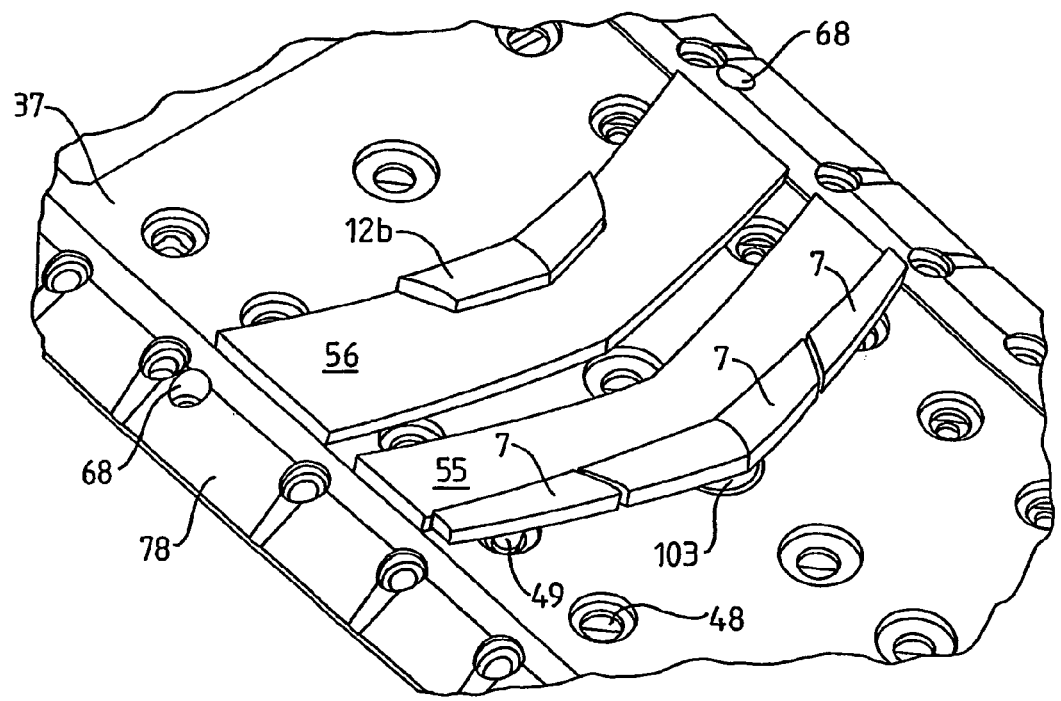
FIGS. 15 and 16 are perspective views of a partially constructed input region of the device.
Figure 16:
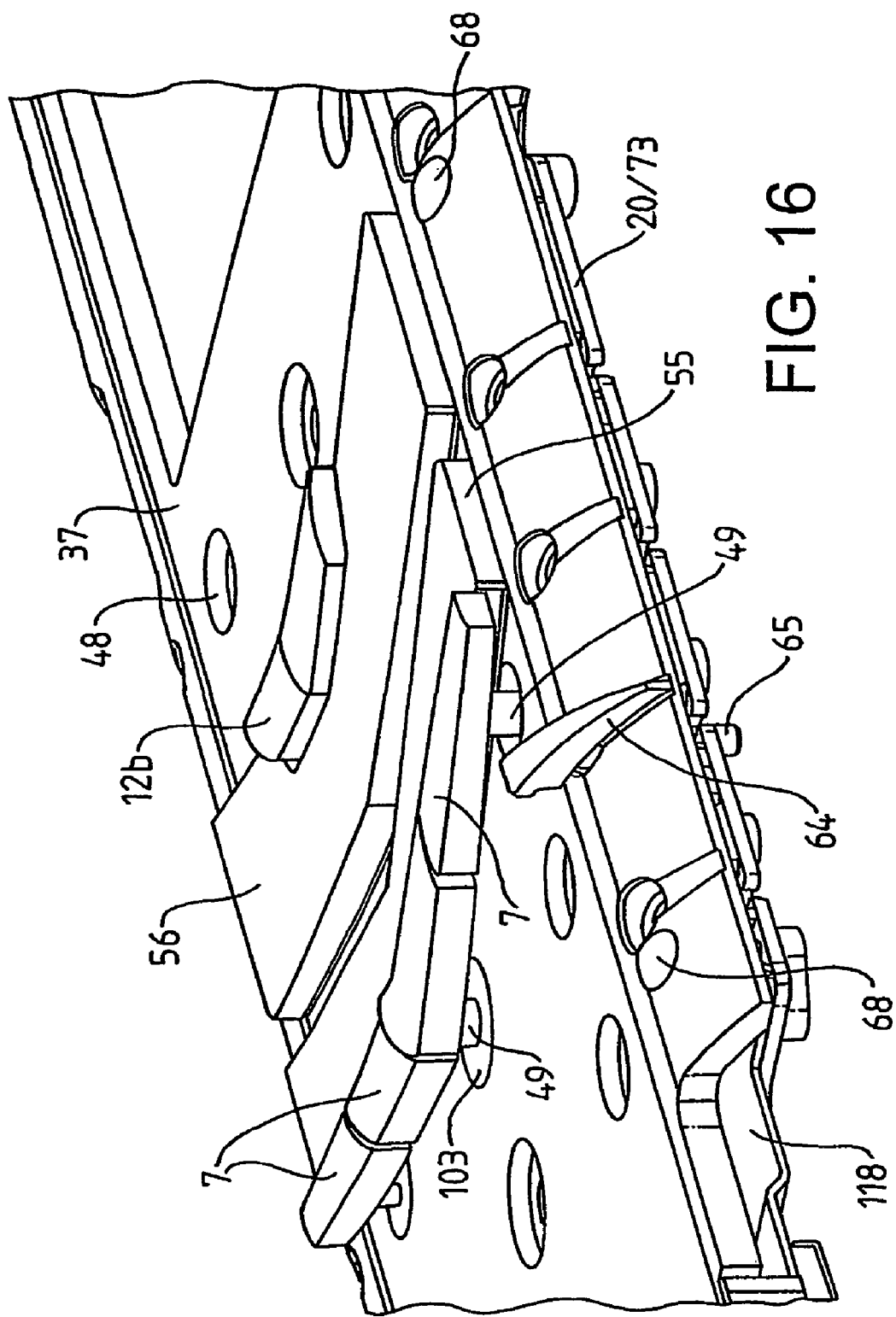

In this way light is pumped into the light guide 14 along the major axis from above the LCD 25. The light from the light pipe 39 illuminates the display region 4 and provides lighting for the input region 5. As illustrated in FIG. 15, additional LEDs 43 or other lighting elements are positioned along the edges of the Perspex layer or sheet 37 in the input region 5 to further illuminate the legends 15 for the keys of the array 6. The surface of extending portions 78 of the Perspex layer or sheet 37 is shaped to channel light from adjacent top firing LEDs 43 or the like towards the upper surface of the main portion of the layer or sheet 37. This assists in providing substantially uniform lighting for the input region. The additional LEDs 43 or the like are shielded from view by the bezel 19 to avoid light spots being visible and encouraging a uniform diffuse light across the light guide.

The LCD 25 itself is bonded to the rear surface of the Perspex sheet 37 with an energy absorbing adhesive sheet 45. Using this technique and ensuring that there are no air gaps between the front of the LCD 25 and the Perspex sheet 37, provides a robust solution for mounting the LCD 25. The surface of the LCD 25 that is delicate and generally needs a protective layer distanced from it is protected by the Perspex layer 37 adhered to one of its faces. The drivers 44 for the LCD 25 can be seen in FIG. 5.

In the embodiment illustrated the Perspex layer 37 includes apertures 48 for locating individual keys and allowing the key shafts 49 to travel to make contact with a printed circuit board 50 located within the casing 2 to register user input. An independently inventive key layout, suitable for use with the general concept discussed, will be described in greater detail below.

Figure 4:
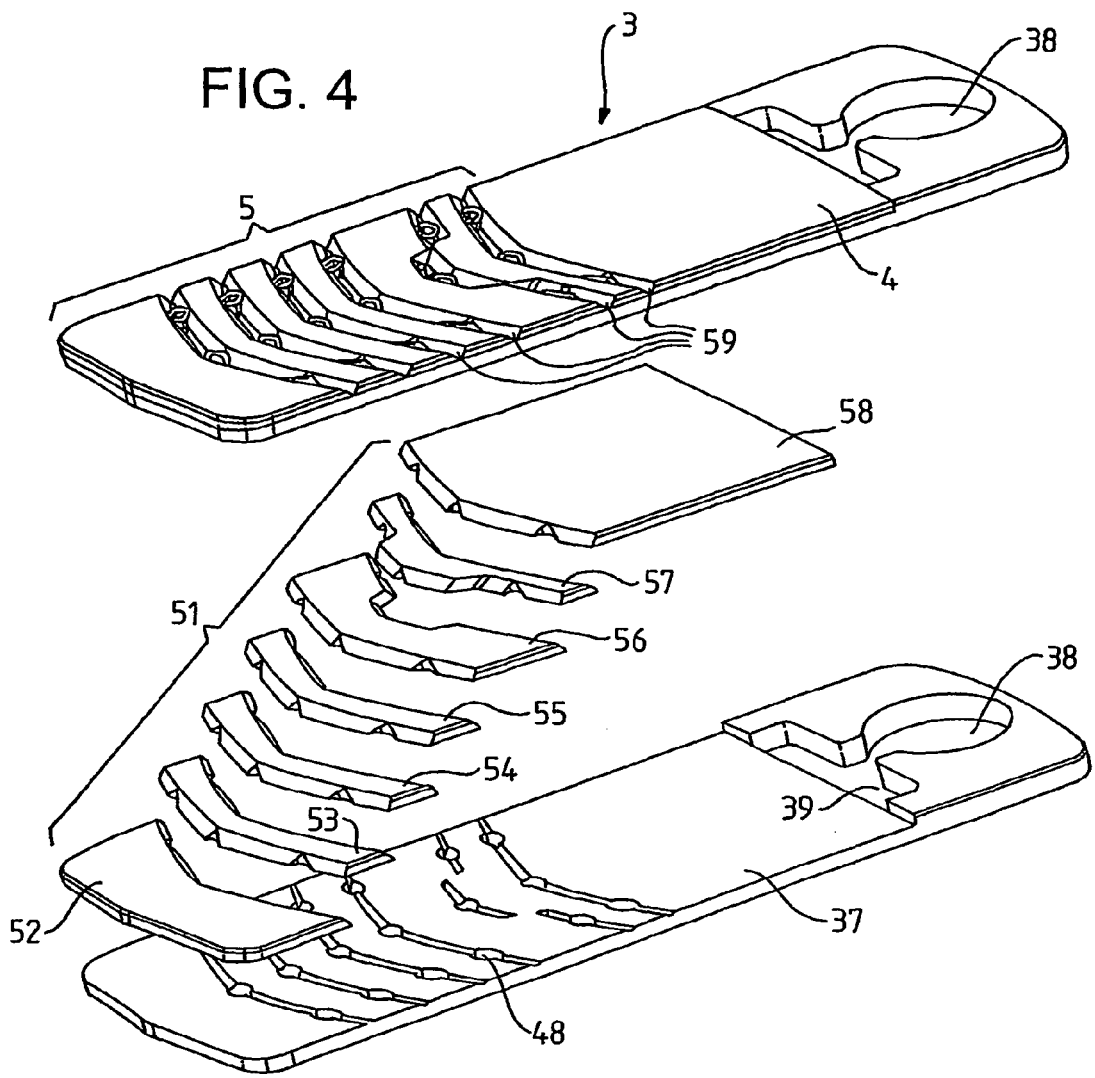
FIG. 4 is an exploded view of the face of a communication device of one embodiment of the invention without keys.
Figure 5:
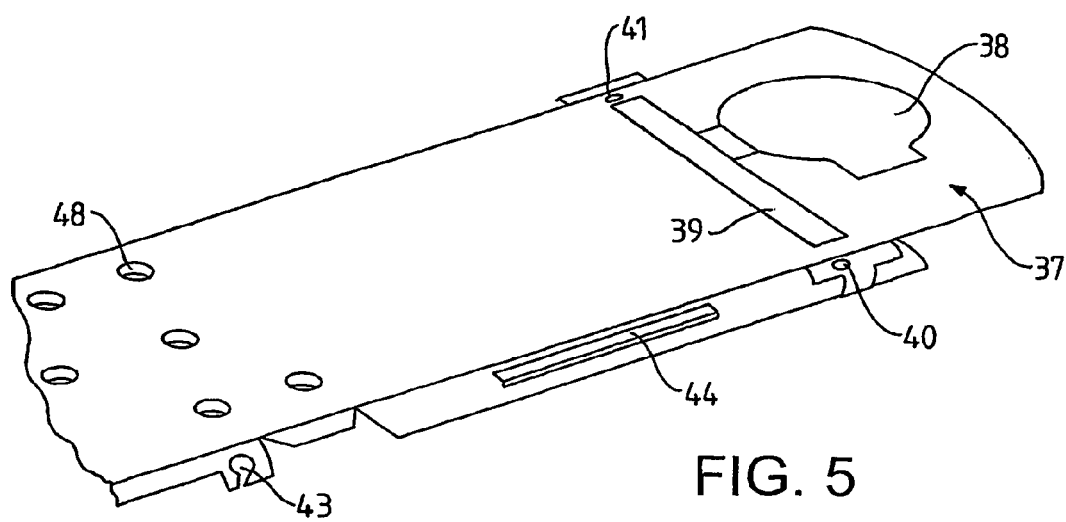
FIG. 5 is a view of one layer of a light guide.
Figure 8:
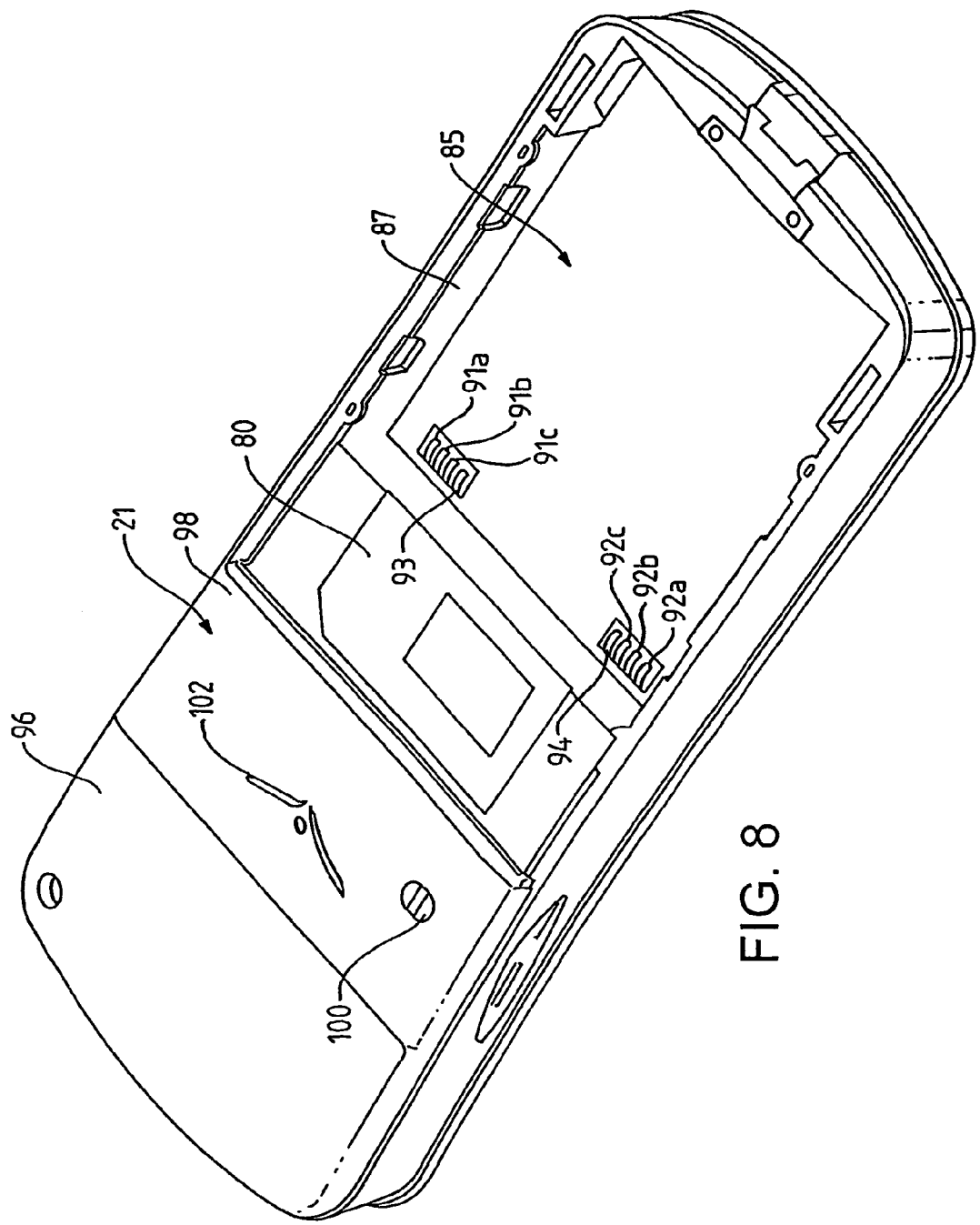
FIG. 8 is a perspective view of the rear of the device with the battery cover removed.
Figure 10:
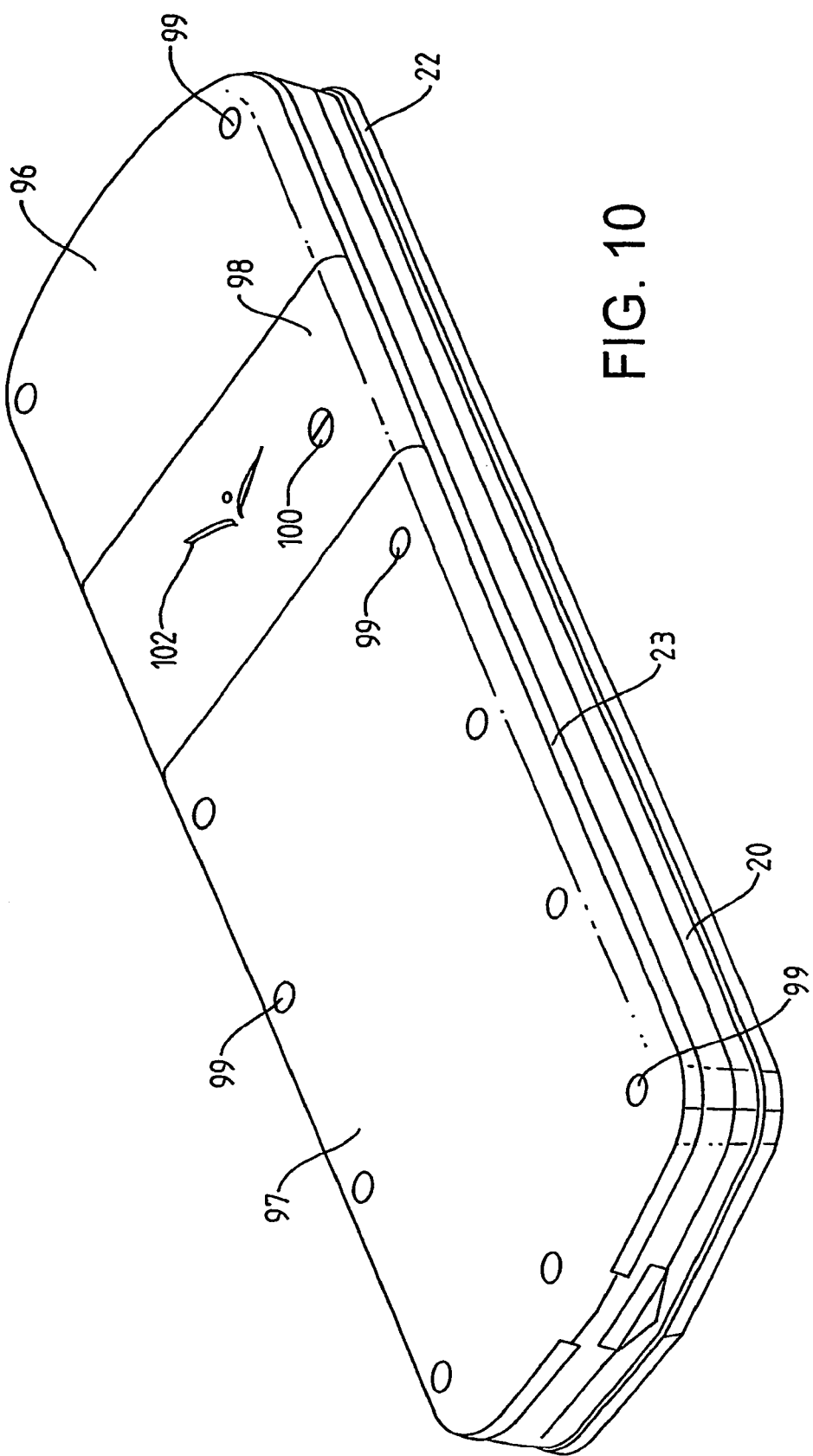
FIG. 10 is a perspective view of the rear of the device with the battery cover in place.
Figure 11A:
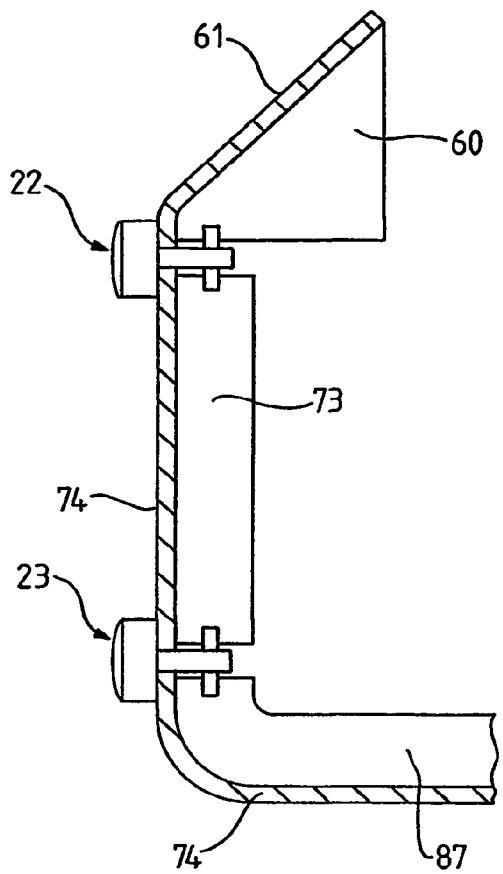
FIGS. 11a and 11b are sections showing other embodiments of the invention.
Figure 11B:
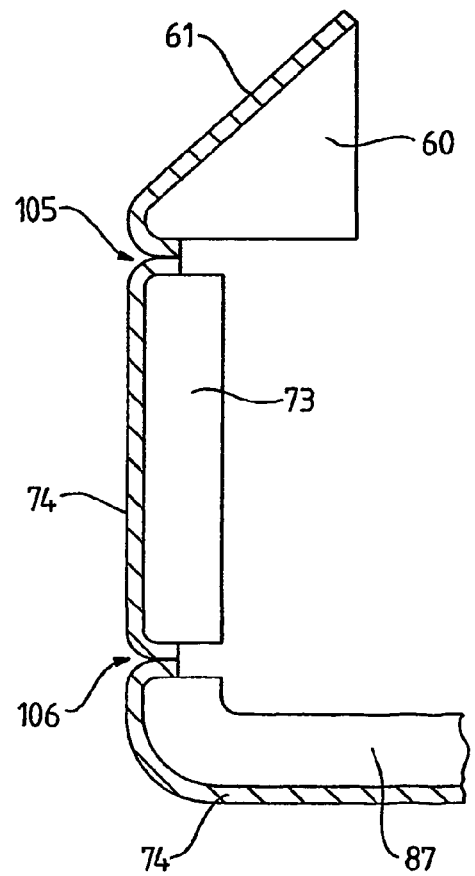

As can be seen most clearly from FIG. 4, the second layer of the composite light guide 51 is made in a number of sections 52-58. This is to allow for the choice of brittle materials to be used for the second layer 51. Sapphire has properties including its scratch resistance and optical clarity that make it suitable for use in this context. Other transparent or translucent materials such as glass or other minerals would also be suitable. The light guide provides a suitable external surface to the device. Arrangements for the second layer similar to those disclosed in concept in the illustrated embodiment are not necessary when the materials are not brittle. Alternative arrangements will, however, be apparent to the skilled man for accommodating brittle materials in this context.

As mentioned above sapphire is brittle. When considering how to introduce such a material into a casing 2 that is to be long lasting and durable, problems arise. This is particularly the case when the device 1 will inevitably be subjected to knocks and is likely to be dropped many times in its long existence. All brittle parts are bonded to a carrier formed from e.g. plastic or titanium in order to better absorb shock. In the embodiment described, the sapphire is formed in individual sections 52-58 for ease of manufacture. Each of the pieces is adhered to the Perspex layer 37 using a UV curing adhesive based on hybrid acrylic technology. In order to increase the durability of the composite light guide 14 and strengthen it against damage, the sections 52-58 are adhered to a more flexible Perspex layer 37 leaving gaps 59 extending across the entire width. These gaps 59 act as hinges to allow the composite layer 14 to be relatively flexible along its major axis. In the embodiment illustrated, the layout of the key array 6 has been designed with this in mind. The alpha numeric keys 7 are arranged in groups of three extending across the whole width of the second layer of the composite 51. The function keys or soft key 8, 9 are also arranged in two groups of three. The soft keys 8, 9 and the top scroll key 12a follows the line of the alpha numeric keys 7. The call handling keys 10, 11 and the bottom scroll key 12b, which is displaced from the line of the others, defines the lower edge of one of the elements 57 and the upper edge of another of the elements 56. This makes the second row of keys 10, 11, 12b distinctive whilst still avoiding problems in manufacture of the elements 52-58. The specific key array 6 illustrated has other properties and advantages that will be discussed later.

Although the embodiment described is designed with a brittle material such as sapphire in mind, the resultant arrangement could be formed from any number of other materials including plastics that provide the required optical characteristics. Similarly different key arrangements could be used without departing from individually inventive concepts that are disclosed.

When using a brittle material for a front face light guide 14 problems are also encountered when connecting the front face 3 to the rest of the casing elements. In the illustrated embodiment the edges of the brittle elements 52-58 are protected by the bezel 19 that sits around the whole of the face. The bezel 19, in this embodiment, is formed from a bezel support 60 overlaid with a 0.5 mm thick metal sheet, the bezel cover 61. The metal sheet 61 is bonded to the bezel support 60, that may be formed from plastic, with an adhesive such as a two part epoxy adhesive or a two part acrylic adhesive. As the metal sheet 61 is relatively thin this keeps the weight of the casing 2 down and also allows relatively precious metals such as titanium or gold to be used at relatively lower cost. The bezel 19 could, however, be a single part and/or be formed from a single material for example titanium.

The transparent face 3 in this particular embodiment is securely held in place by a robust mechanism. The Perspex layer 37 to which the elements 52-58 are bonded extends beyond the area covered by the elements to provide a lip or edge 62 around the whole of the composite light guide 14. This edge 62 is used to secure the front face 3 in position as it is tucked under the bezel 19 that defines the perimeter of the front face and squeezed between the bezel 19 and the side frame 20. This arrangement provides a direct route for impacts to be dissipated through the bezel and side frame without damaging the brittle front surface.

As can be seen in FIG. 1, the bezel 19 is punctuated with front face protectors 63 whose function will be described in more detail later. These front face protectors 63, in this particular embodiment play a role in holding the casing elements together. The protectors provide contact points that define a contact plane that prevents the brittle front surface from making contact with the ground, for example, if dropped.

The front face protectors 63 have a tip part 64 that extends over the bezel 19 and a shaft 65 that passes through the bezel 19 and into the plastic side frame 20. The shaft 65 may be tightened onto the frame 20 using a nut 95. In this case the nut stops the front face protectors from falling out of the device. In one embodiment the shafts 65 are screwed into the tips 64 at one end and into the side frame element 20 at the other although other manners of connection could be employed. The shaft 65 and tip 64 could also be one piece rather than two. The bezel 19 and the Perspex layer 37 of the transparent face 2 are captured by the front face protector 63 and side frame element 20 as can be seen in FIG. 9b. The front face protectors 63 accordingly grip the transparent face 3 securely between the side frame 20 and the bezel 19. The front face protectors 63 are only located next to the key array 6. In order to secure the transparent face 3 around its perimeter additional screws 66 are added to draw the bezel 19 towards the side frame 20 and squeeze the transparent face 3 in place. In one embodiment, the screws 66 thread through the side frame 20 and tap into the bezel support 60. Once the bezel support 60 is secured to the side frame 20 the outer shell 61 of the bezel 19 can be adhered to the support 60 to hide the tapped screw ends 66. Alternatively the bezel 19 is stuck to the support first (a sub-assembly) and this sub-assembly is then screwed to the frame.

As can be seen in the figures, although the more flexible transparent substrate 37 is overlaid by the bezel 19 secured in position by the front face protectors 63 and other connectors, the sapphire is maintained spaced from the bezel 19 so that it is protected from chipping or other damage as a result of contact. The edges of the sapphire elements do not protrude above the edge of the bezel 19 to provide further protection for the more vulnerable edges. In the arrangement described, the transparent face 3 is gripped in position between the bezel 19 and the side frame 20. The more flexible substrate 37 could, however receive screws or other fasteners to located it relative to the other frame members without damaging the more brittle sapphire layer.

As the protectors 63 are located in the bezel that is made of more robust material, and define the contact plane, all impulses are directed through the protectors and are dissipated through the bezel away from the brittle elements, in particular the front face. In this way the brittle front face is protected. The contact plane additionally inhibits the travel of the keys. This means that shocks introduced to the front face by the key contacting the ruby bearing through the handset being dropped face down for example are also channelled through the protectors 63 and dissipated in the more resilient bezel, bezel support and plastic side frame. This avoids to a large extent such impulse energies dissipating through the ruby bearings and fragile front which may cause them to weaken or shatter.

To reduce the ingress of dirt or fluids a sealant 69 is located between the bezel 19 and the transparent face 3. One way in which this can be introduced is to paint a seal on the underside of the bezel 19 which when dry is compressed between the transparent light guide 14 and the bezel 19 when the bezel 19 and the side frame 20 are pulled together.

As can be seen in FIGS. 6 or 9, a first rail 22 is located in the interface between the side frame element 20 and the front face 3. The rail 22 hides the discontinuity between the parts from sight and protects vulnerable edges to enhance the durability of the device 1. The rail 22 may be a stamped metal piece 'T' shaped in section extending around the perimeter of the side frame 20. The stem of the 'T' 68 is trapped between the side frame member 20 and the bezel 19 as these two pieces are drawn together on assembly. The stem of the T has apertures 70 that sit over corresponding projections 71 on the side frame 20 member to prevent it from being withdrawn from between the two parts when in position. The top of the T acts as a carrier plate to which an additional extruded piece 72 is soldered or otherwise adhered to provide a seamless finish. The stem could instead be formed from a plastics material.

The side frame member 20 in this particular embodiment is a plastic support 73 with an exterior cover 74. The cover 74 may again be a metal sheet or perhaps a wood veneer or another layer such as leather. The bonding agent most suitable for adhering the layer to the plastic frame member 73 will differ depending upon the materials that need to be adhered. For metal to plastic a suitable adhesive is a 2 part epoxy resin or 2 part acrylic adhesive. For metal to metal the adhesive would be a reactive polyurethane film or a two part epoxy resin. Similarly the back cover 21 in this embodiment may have a plastic frame and be covered with for example a leather, wood or perhaps metal veneer. With the flexible veneer materials such as leather, it is preferable for the material to be taut on the frame. This is achieved during the veneering process using conventional techniques. The back could also be formed from a ceramic material.

The transparent face 3 provides a seamless transition between the display 4 and the input regions 5. In the display region 4, the LCD 25 is located behind the transparent face 3 and in the input region 5 the key mechanism 75 lies behind it. In one embodiment described, the key mechanism 75 can be seen through the front face 3. However, in other embodiments the inner surface 76 of the Perspex substrate 37 may be coated with an opaque material to prevent the inside of the device being seen. Alternative methods of obscuring the inner workings of the device from view such as introducing additional opaque layers or obscuring the view in other ways will be apparent to the skilled man.

For embodiments where, for example, the key operating mechanism 75 can be viewed through the front face 3, it may be desirable to obscure the PCB 50 from view.

The constructed casing 2 provides a housing for the printed circuit board 50 holding the engine components 24, and a battery 79. When the device 1 is a radio telephone, a SIM card holder 80 is provided to accommodate a SIM card 81. For operation under some radio protocols this will clearly not be necessary.

Returning briefly to the front of the device, located above the display region 4 is the pillow 16 so named because it designed for the user to rest his or her ear against when making a telephone call. The pillow 16 overlays the ear piece 18 of the device. As described previously there is a cut-out in the Perspex substrate 37 of the light guide 14 to accommodate the ear piece 18, the pillow 16, in the illustrated embodiment is adhered to the Perspex substrate 37 covering the ear piece 18. The pillow 16 provides suitable apertures 17 to channel sound to the user.

The Perspex and sapphire light guide 14 is relatively cold to the touch, the material of the pillow 16 can be chosen to be a material that is inherently warmer to the touch and less prone to marking than a transparent shiny surface. Materials that are thought to be particularly suitable are ceramics or wood and leather veneers. The shape of the pillow 16 obscures part of the LCD 25, providing opposing triangular sections 82, 83 that are used to indicate battery capacity and signal strength respectively.

To complete the structure, the casing 2 has a rear cover 21 and internal compartments 84, 85 suitable for retaining the engine 24 the battery 79 and in this embodiment a SIM card 81. The device illustrated, in common with many other radio telephones, advantageously allows access to the battery compartment 85 as the battery 79 may periodically need replacement. In order for the engine 24 to be protected during this activity, the battery 79 is retained in a compartment providing connectors to the engine 24. Along side the battery compartment 85 in this embodiment is the SIM card holder 80. Under protocols where a SIM card 81 is used to hold subscription information, the user may wish to remove the SIM card 81. For this reason it is convenient for the back cover 21 to be removable to expose both the battery 79 and the SIM card 81. The battery compartment 85 and SIM card holder 80 are provided by an internal casing element 87 that is secured to the side frame 20. This may be formed from plastic or one of many other suitable materials. In one embodiment the compartments are formed from stamped metal sheet which may be stainless steel.

The battery contacts 90 protrude into the battery cavity 85 to provide a simple way of connecting the battery 79 to the engine 24. The battery connection will typically be have a power connector 91, a ground 92 and two signal connectors 93, 94.

In the embodiment illustrated, the power 91$a,b,c$ and ground 92$a,b,c$ connectors are divided into three. This reduces the resistance between the battery 79 and the engine 24 as the leads are in parallel, it also reduces the chance of power being lost to the engine 24 as a result of a harmonic resonance frequency of the connector being reached as at all times there is likely to be at least part of each three part connector completing the circuit between the engine 24 and the battery 79.

The casing 2 is completed by assembling the back cover 21 to the side frame 20. In the illustrated embodiment, the back cover 21 is formed from three pieces 96, 97, 98. A first piece 96 overlays the antenna location. In this embodiment it provides an aperture 99 in which the polyphonic speaker 27 is located to provide for polyphonic sound. This additional speaker 27 has not been optimised for use in close proximity to the ear as has the speaker 18 located beneath the pillow 16. This allows it to be more effective as a handsfree speaker and enables a greater range of ring tones to be utilised. As the first piece 96 also covers the antenna its dielectric constant is relevant.

In a device of this type where the casing 2 is to survive generations of engines 24, the materials from which is formed are important. They should be hard wearing and durable, retaining their attributes for years longer than is currently required. For this reason ceramics have been considered for the back cover 21 for some embodiments of the invention. With ceramics, however, despite having many desirable characteristics, for locations near an antenna relevant for devices containing such an element, the dielectric constant of the material interferes with the desired transmission pattern.

To provide many of their desirable characteristics without the dielectric constant becoming too high, the rear cover piece 96 can be formed from a material with a lower dielectric constant with a suitable depth of layer deposited on it. This technique and suggested materials could be used for other elements of the casing.

The rear casing element 96 covering the antenna is again screwed to the side frame element 20 and in the process captures the second rail 23 similar in construction to the first rail 22 between the side frame 20 and the back cover 21. Again the rail 23 is provided with apertures 70 that are positioned over corresponding projections 71 on the side frame 20 to more securely hold the rail 23 in position when the back cover 21 is attached.

A second rear casing element 97 covers the battery compartment 85 and the SIM card holder 80. This element is releasably secured to the other casing elements using screws 99 to allow relatively easy access to the SIM card 81 and battery 79. In a preferred embodiment a quarter turn of a screw 100 releases the cover element 97 to allow it to be removed. The same action can disconnect the battery 79 to allow the SIM card 81 to be removed.

The second rear casing element 97 is attached to the side frame 20 in a similar manner to that described in relation to the first rear casing element.

The third element of the rear casing 98 covers the handsfree speaker 27. This may be only relatively thin and formed from a precious material such as gold. It will be provided with a suitable aperture 102 to channel sound from the polyphonic speaker 27 that may be used in hands free mode and for providing an audible ring tone.

In the embodiment described the front 3 and rear casing elements 96, 97, 98 are secured to the side frame 20. A silicon sealant 69 or similar may be extruded around the inside of the back cover 21 to prevent unwanted ingress of dirt and fluid.

The skilled man will realise that the number of parts and the manner in which they are connected can be changed without departing from the several inventive concepts described. For example, in other embodiments the casing may be held together using other techniques and in other ways.

As well as obscuring exposed edges, the rails 22, 23 provide additional elements for customisation as they can be formed from a variety of different materials, in particular different types of precious metal for example gold or platinum. They also act to protect vulnerable edges of veneered frames from exposure to potentially damaging forces. In doing this unsightly edges are obscured from view. This provides quality and durability in keeping with the overall concept of a retainable casing for a communications device. Regardless of the material of the veneer, this is a convenient arrangement for securing all the elements in place for a durable finish.

In an alternative embodiment illustrated in FIG. 4*b*, instead of providing rails 22, 23 to protect exposed edges, the adjacent edges themselves are turned inward 105, 106 and held in close proximity. This arrangement also provides the advantage of protection and keeps unsightly discontinuities from view.

Figure 12:
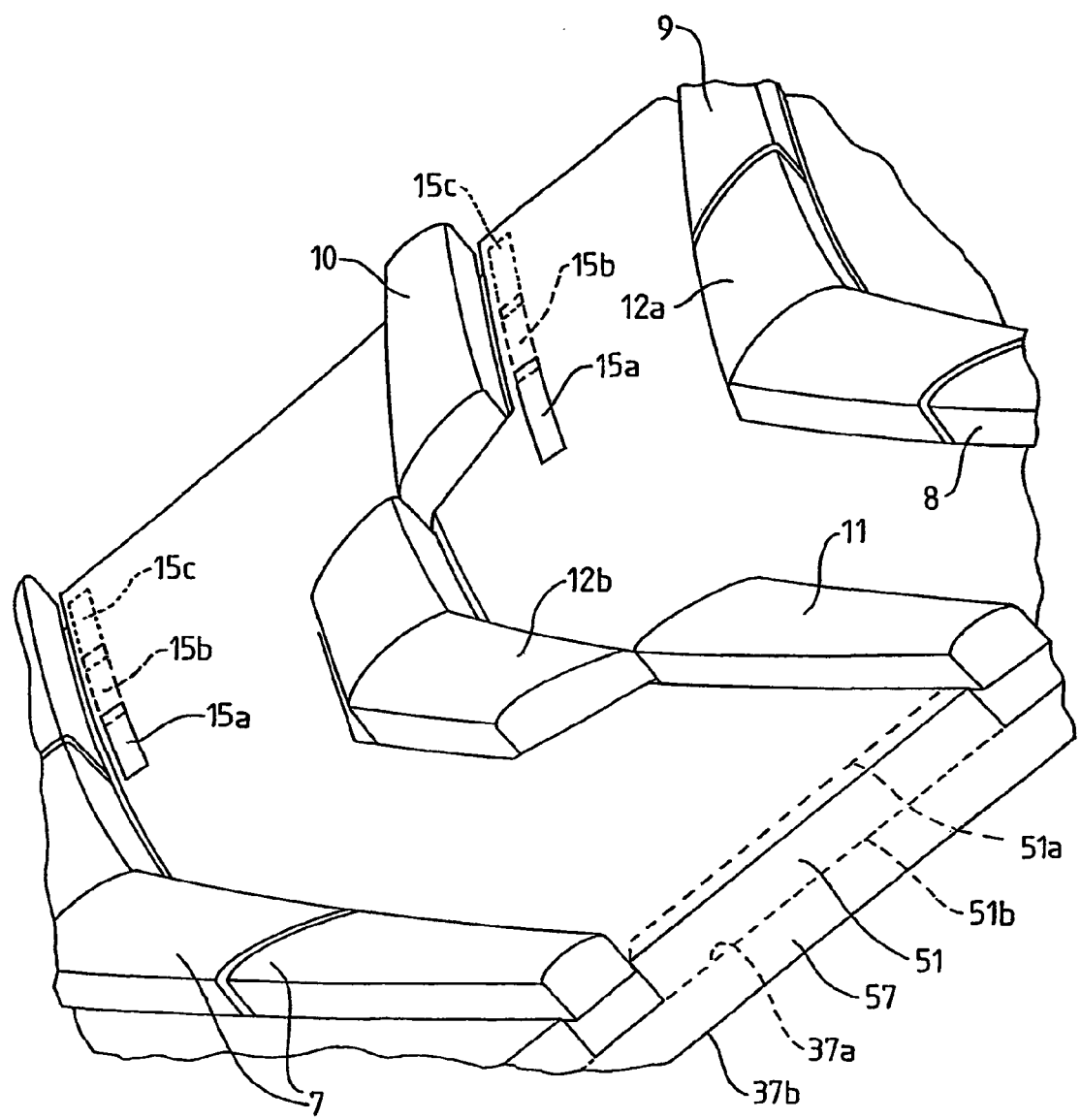
FIG. 12 is a perspective view of part of the input region of the device illustrating the location of legends associated with keys.
Figure 13:
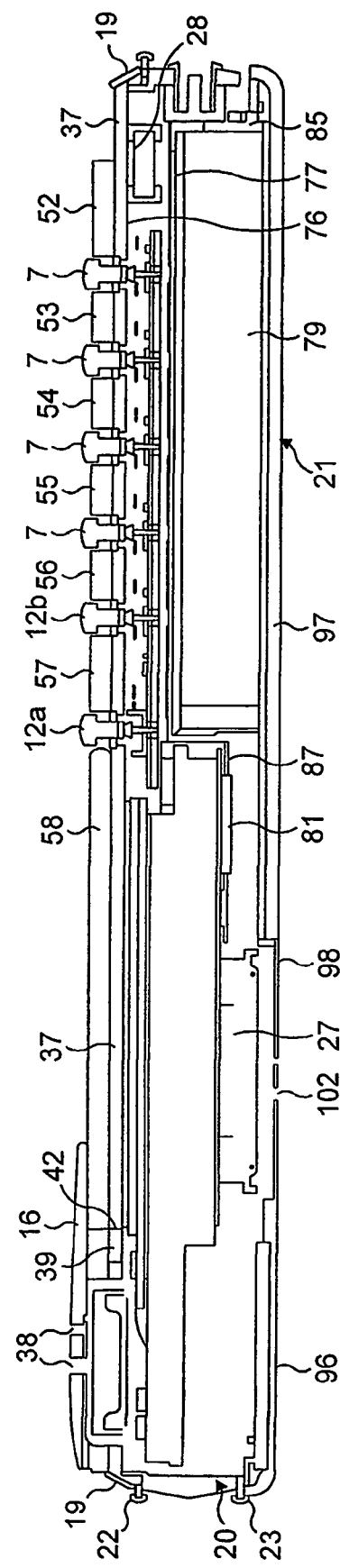
FIG. 13 a longitudinal section through the communication device.
Figure 14:
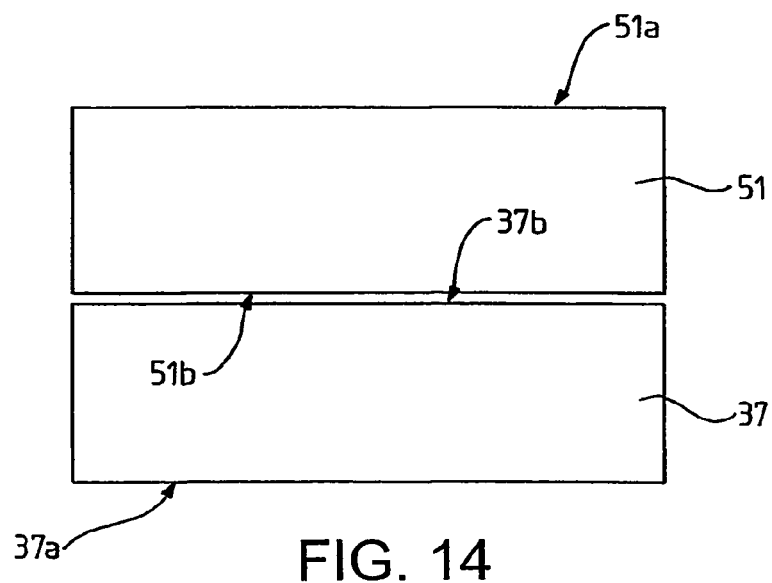
FIG. 14 is a schematic section through the light guide illustrating the surfaces available for carrying the legends.

A casing with an optically permeable front face provides new opportunities. In a particular embodiment, described with reference to FIGS. 12 and 14 legends 15 associated with the keys of the key array 6 are located on both the front 37*a* and rear 37*b* surfaces of the Perspex layer 37. With communications devices becoming ever more sophisticated, it is common for each key provided to have a number of different functions. It is useful to be able to label visually the different possible functions associated with a key. For the alpha numeric keys 7 in particular, each key is associated with a single digit and a group of letters or symbols. Ideally these should be displayed clearly. Historically the keys have held the associated legends. As devices have become smaller this has, however, becomes more difficult, it being an especial problem to distinguish between the different legends for respective modes of operation as the letters and numbers are so small. In the illustrated embodiment, the legends 15 for associated keys are located on respective surfaces of the light guide 14, which as the device is tilted, move together or apart depending upon the angle from which they are viewed. This provides a visual distinction between the legends 15 on the different surfaces which can be used to distinguish between the modes of operation. As the front face is optically permeable, the legends appear to float in or above the device. By spacing the legends along an axis perpendicular to the third dimension, the thickness of the front face, the front face is given some prominence, thus an additional dimension has been added to the normally opaque front face.

In the embodiment illustrated the legends 15 are located on the outermost and innermost surfaces of the Perspex layer 37*a*, 37*b*. The legends 15 appear to be floating in the light permeable layer. The manner in which the legend 15 is located on the layer is a matter of choice for the skilled man. One method is to print the legend on to the surface using an etched plate filled with ink. Another way may be by using PVD (Physical Vapour Deposition) techniques to deposit the 'printing' directly onto the Perspex layer. Other techniques for fixing legends could be used including attaching labels.

In the embodiment discussed the legends 15*a* 15*b* are located on opposing surfaces of the Perspex layer 37*a* 37*b*. This enables a single element, the Perspex layer 37, to be printed instead of each of the sapphire or other pieces 52-58. Problems encountered with ink wearing off when printing techniques are used are also avoided by protecting the surfaces containing the printing with the second layer. In other embodiments and to increase the depth of spacing of the legends and hence the separations possible when viewed at different angles it may be desirable to place the legends on the innermost 37*a* and outermost surfaces 51*a* of the composite. In order to fix the legend 15 printed on the outer surface 51*a* where it may encounter wear, a coating or other protective layer may be provided over the surface. This may not be necessary if PVD techniques are used to produce the legend 15 as such techniques produce a bond between the deposited layer and the substrate that is more hard wearing. In still other embodiments the legend 15 could be provided on the underside 51*b* of the sapphire elements and on the innermost layer of the Perspex substrate 37*b*. Again by avoiding the external surfaces of the transparent layer the problem of wear of the legends 15 is largely avoided. The outermost legend is protected by the top layer 51 of the composite light guide 14 and the innermost legend 15 is not accessible.

In sandwiching the legends between two optically permeable layers 37, 51 which of the two sandwiching layers carries the legend is largely immaterial. The properties of the respective materials, if indeed they are different, and other factors can be taken into account in deciding which layer 37b, 51b actually carries the legend. With a composite optically permeable substrate, the more layers that are provided, the more visually distinguishable legends can be accommodated. For example with two composite layers there are three available planes for legends, with three layers, four planes and so on. If all the legends were placed adjacent a single key, the visual distinction may cause difficulty with large numbers of layers being used to distinguish functionalities. Other embodiments could use the different planes for legends at different locations on the device so that one set of keys has a legend in a first plane, a second set of keys in a second plane and so on.

To accentuate the illusion of the legends floating, or to increase the distinction between the two layers, the thickness of the optically permeable layer between the respective layers carrying the legends can be increased. In the same way these features can be reduced by decreasing the thickness between the planes carrying the legends.

The ink or paint can be chosen by the skilled man to provide a number of effects. The ink may, for example, be required to pearlesce or fluoresce, or be black, white, or one or more of a wide range of colours. As the legend is located on a light guide, fluorescent and pearlescent materials enhance the visibility of the legends.

Instead of techniques that add ink or other visible materials to the surface merely etching the layers may be sufficient to make the legends visible if the illumination is adequate.

Embodiments illustrating the location of legends associated with keys in a light permeable face has been described with reference to the illustrated embodiments in the context of other independently inventive features claimed in co-pending applications. The skilled man will realise that many alterations to the specific features disclosed can be made without departing from the scope of the invention.

The input region of the device will now be described in more detail, primarily with regard to FIGS. 9 and 15 to 21.

The input region 5 comprises a key array 6, as described above. In this embodiment, the key array is made up of a plurality of individual keys 7-13. Each of these individual keys comprises a key tip 64 and shaft 49 extending from substantially the centre of the key tip 64, together with an upper bearing 103, O ring 107, circlet 108, spring plate 110 and lower bearing 109 positioned respectively along the shaft 49a from the key tip 64. The spring plate 110 is supported by a spring plate support 114 provided on the PCB 118. The spring plate comprises a main body, and a tongue 111 formed from a single piece of sheet metal. The tongue has been formed by stamping an inner portion of the sheet, so that two sides and an end of the tongue are free from the remaining main body of the sheet. The spring plate also has a portion or portions stamped out to provide an aperture for the key shaft 49 and spring plate support 114. One end 113 of the spring plate comprises contacts for contacting respective contact regions on the PCB. As will be appreciated by a person skilled in the art, a single contact could be used for this purpose, but the provision of two contacts provides greater reliability. The spring plate support 114 comprises three members upstanding from the PCB 118. These members may form part of a unitary structure, or may be separate elements. The first member comprises a recess 115 dimensioned to receive one end 112 of the spring plate 110 and hold that end 112 in position. The second member of the support 114 comprises a lip 116 extending towards the first member. This lip 116 is provided to restrict the upward movement of the other end 113 of the spring plate 110. The third member of the support 114 comprises a recess 117 for receiving the end of the tongue. This third member is positioned relative to the second member, such that the tongue of the spring plate 110 has to be flexed in order for the end of the tongue to correspond with its recess 117. Optionally, the spring plate support may comprise a fourth member comprising a lip extending towards the second member. In this case, the PCB contact regions are extended to the surface of this lip, so as to bring them closer to the spring plate contacts. Alternatively the contact region bearing lip may be formed as part of the second member itself, or eliminated altogether.

As mentioned above, in the present embodiment, the individual keys are grouped in threes, their tips extending across the whole width of the second layer of the composite 51. This facilitates manufacture of the brittle elements 52 to 58. The tips of the alphanumeric keys 7, soft keys 8, 9 and top scroll key 12a are in alignment with those of the other keys in their group. In the remaining group of keys, however, the tip of the bottom scroll key 12b is displaced from the line of the tips of the other two keys in its group, namely the call handling keys 10, 11. In any event, in each group the edges of adjacent key tips complement each other, and are closely spaced. This eliminates the need for the composite 51, or other filler material, to extend between the key tips. It also has the advantage of simplifying the overall appearance of the input region of the device to the user. Further properties and advantages of the specific key array 6 will be discussed below.

Figure 17:
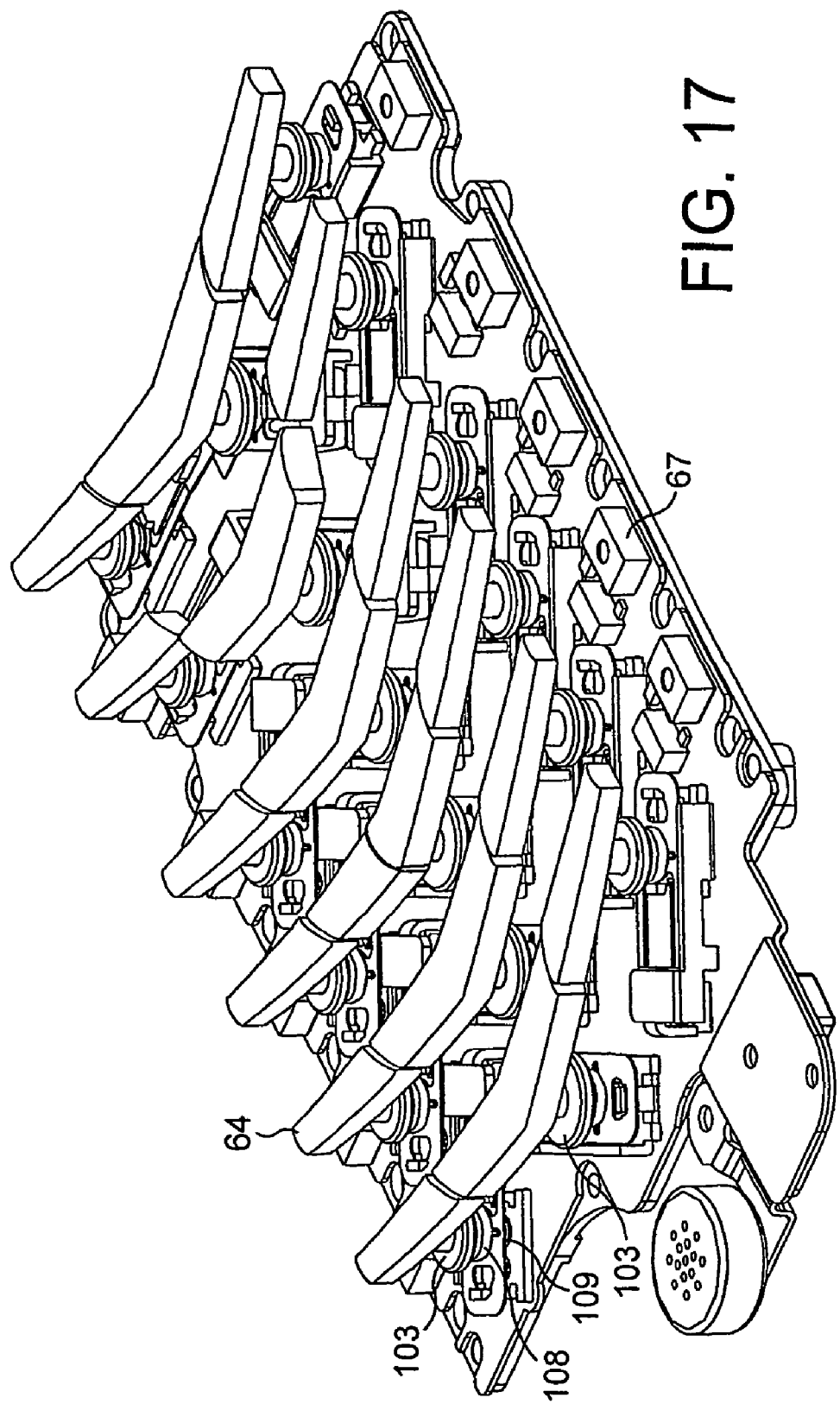
FIG. 17 is a perspective view of keys of the device including their actuation mechanisms.
Figure 19A:
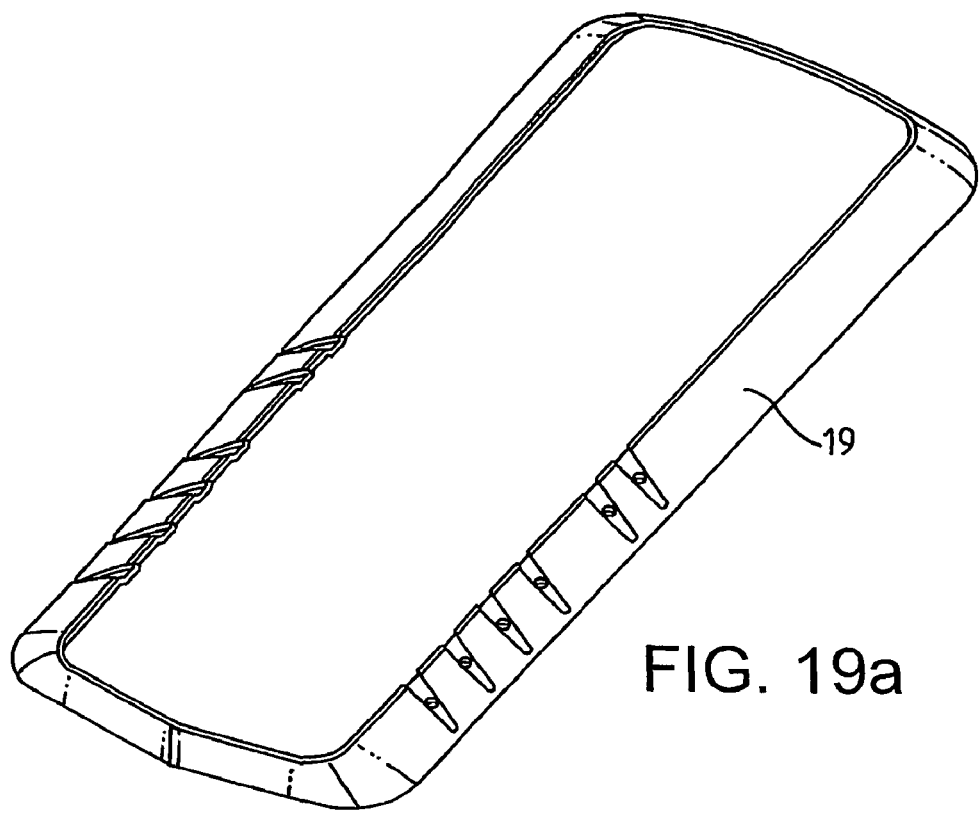
FIGS. 19a and 19b are front and rear perspective views of the outer shell of a bezel respectively.
Figure 19B:
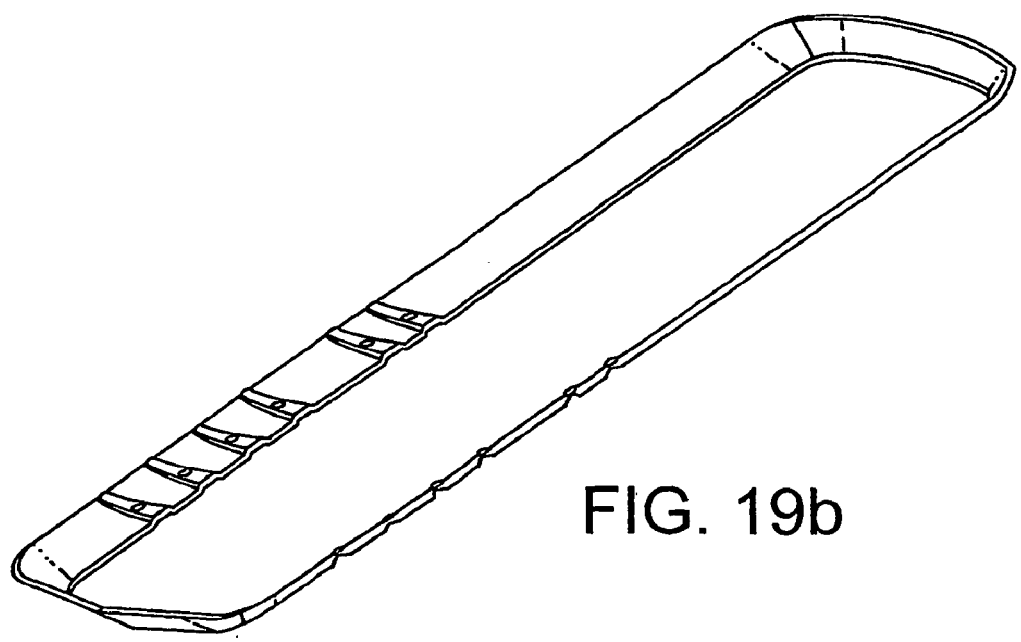

As can be seen in particular from FIGS. 17 and 18, the spring plates 110 and supports 114 of adjacent alphanumeric keys 7 are positioned perpendicular to each other. This provides a geometrically simple solution to the problem that the spring plates cannot be positioned in alignment with the keys themselves. One cause of this problem in the embodiment illustrated is that the spring plate of each outer key is longer than the average length of its corresponding key tip, and this extra length cannot be accommodated elsewhere. This is primarily because the spring plate of each central key is only minimally smaller than the average length of the corresponding key tip, and the keys are closely abutted (there is only a gap of about 0.245 between the keys) so that there is insufficient space to allow for the extra length. Furthermore, whilst the key shaft 49 of each key is substantially central to the key tip 64, the key shaft aperture of the spring plate 110 is off-centre. This exacerbates the problem for the outer keys, and even results in the spring plate of each centre key not being able to be accommodated in the space under its corresponding key tip.

The keys may be constructed, and the input region of the device assembled as follows. Upper bearings are inserted into the apertures 48 of the Perspex layer of the device. Ruby bearings are preferably selected for this purpose, for three main reasons. Firstly, ruby is very hard wearing, and will thus be able to handle multiple operations of the keys over a substantial period of time. Secondly, the upper bearings of this device are larger in diameter than the corresponding widths of the key tips, which means that they will be visible in situations in which the front face of the device is transparent (e.g. second layer 51 may be sapphire). Hence, advantage may be taken of the fact that a ruby is an attractive jewel, which the user will be pleased to see. Thirdly, the use of a hard material such as ruby will provide greater accuracy of fit of the key in the device, as opposed to using a resilient material, such as PFTE.

Lower bearings 109 are provided in a titanium plate which is fixed to the rear of the PCB 118. The inner and outer diameter of the lower bearings 109 are smaller than the upper bearings 103, but their centres are aligned. They are also preferably made of different material—the material of the lower bearings having shock absorbing qualities such as PFTE.

The key shafts 49 are machined, to have a first portion 49a of appropriate thickness to pass through the inner diameter of the upper bearings 103 and a second reduced diameter portion 49 to pass through the inner diameter of the lower bearings 109. Shaft 49 and circlet 108 may be machined from a single piece of metal, or the circlet 108 may be subsequently attached to the shaft 49. They are preferably formed of stainless steel. Further, an O ring 107 is provided adjacent the circlet 108, on the thicker diameter portion 49a of the shaft 49, to provide a water seal. Both the circlet 108 and the O ring have an outer diameter smaller than that of the upper bearing, so that they are not visible to the user when in situ. However, the circlet has an outer diameter sufficiently larger than the inner diameter of the upper bearing, so as to prevent the key from falling out of the device.

The key tips are crafted into the desired shape from a desired material, which may be a metal such as gold, platinum, silver, or stainless steel. They may also bear precious stones. For example a key tip or tips may be diamond encrusted, or have a precious stone set in it. Once a key shaft has been passed through an upper bearing, a key tip is joined to it. This may be achieved using conventional braising techniques.

The spring plate supports 114 are provided on the PCB 118. Each spring plate support 114 is preferably of unitary structure, manufactured from lightweight metal such as aluminium. The supports may then be soldered onto the PCB using conventional techniques. The spring plate supports 114 are positioned to hold the spring plates 110 so that the centres of their shaft apertures align with those of the lower bearings 109. Contact regions for the spring plate contacts are provided on the PCB (or the lip of the second or fourth member of the support as described above).

The spring plates 110 themselves are provided by stamping sheet metal, such as beryllium cooper with gold flash or the like. The plates 110 are affixed to the supports 114 by positioning one end 113 of the spring plate under the lip 116 of the second member of the support 114, fitting the other end 112 of the spring plate in the recess 115 of the first member of the support 114, flexing the tongue so that its end corresponds to the recess 117 of the third member of the support 114, and positioning the end of the tongue in that recess. When in position, the free end 113 of the spring plate 110 is naturally biased upwards toward the restraining lip 116.

The dimensions of various components of the keys and their relative positions are important in smooth key operation. The distance between the upper and lower bearings has been maximised by placing them either side of the spring plate switching mechanism and passing the shaft through the spring plate. In such a position, the bearings hold the key straight when it is operated, thereby avoiding contact with neighbouring key tips or the need to place keys further apart to prevent such contact. This, in turn, results in good switching functionality and feel.

Also, the dimensions of the keys are such that the lower surface of each key tip 64 contacts the surface of the Perspex layer 37 before excess pressure can be applied to the spring plate 110. In the present embodiment, the circlet 108 is positioned along the shaft such that it gently rests on the spring plate when the keys are in their normal non-depressed or rest state. Also, the thicker portion of the shaft is of an appropriate length that, when in the normal state, there is a gap between the lower surface of the key tips and the surface of the Perspex layer 37 which is the same as, or only slightly greater than the distance the circlet 108 has to travel to cause the spring plate contacts to contact the contact regions. This overcomes a potential problem of pressure being applied to the spring plate if the switch itself provides the end stop for the motion. The Perspex layer and in particular the ruby bearing limit the travel of the key preventing too much pressure being applied to the spring plate.

The dimensions of the keys are also important for the external appearance of the device. Preferably, the key tips are of a thickness that they protrude from the surface of the second layer 51 of the composite, at least when the keys are in the aforementioned rest state. When the composite is substantially transparent, this will give the impression of floating keys, and add to the three dimensional effect mentioned earlier concerning the key legends 15. Furthermore, the key tips should be sufficiently deep to be partially sunk into the second layer of the composite, and preferably have at least two opposing substantially flat sides which correspond with sides of the second layer to prevent lateral rotation of the keys. A gap of the order of 0.1 mm is achieved in the present device between the keys and second layer of the composite: a gap insignificant to the human eye and suitable for assisting in the prevention of lateral rotation of the keys. Lateral rotation is further hindered in the present embodiment, by virtue of the provision of mirrored slanting of the sides of adjacent keys.

In order to ensure the correct relative spacing of elements of the key, the Perspex layer 37, PCB 118, and titanium plate 77 are clamped together. In this embodiment, the clamping is provided by the front face protectors 63, and by the provision of additional tapped bosses in projections 68 of the Perspex plate and associated fixing means. Consequently, once the keys have been positioned, the Perspex layer, PCB and titanium plate can be clamped together using the bosses and fixing means, thereby holding the keys in place and forming a manageable module. This module may then be readily installed in the device using the front face protectors as described above with reference to FIG. 9B.

Operation of the keys of the device will now be described. As the user applies pressure to a key tip, the shaft moves downwards, travelling through the bearings and shaft aperture of the spring plate. This results in the circlet applying pressure to the part of the main body of the spring plate which defines the shaft aperture. Continued pressure on the key tip will then cause the circlet to apply an increasing force to this part of the spring plate, causing the main body to deform around the circlet. Eventually, this deformation will cause the tongue to overcentre, resulting in the free end 113 of the spring plate 110 flicking from its naturally biased position (upwards towards the restraining lip 116) to a second position, in which the spring plate contacts contact the contact regions on the PCB. An electrical signal is consequently sent to the processor indicative of actuation of that key. This arrangement gives a distinct click providing a clear quality indication to the user that the key has been actuated. As the user removes pressure from the key tip, the circlet, in turn, removes pressure from the spring plate 110.

The tongue promptly returns to its normal or rest position, and the free end of the spring plate flicks up to its naturally biased position, breaking the contact and returning the key tip to its rest position.

If the user did not for some reason release the pressure, the key could not travel indefinitely. It would eventually stop through contact between the underside of the key and a bearing surface. The contact in one embodiment is between the underside of the key tip and the ruby bearing located in the Perspex layer. This arrangement protects the switching mechanism from being pressed. As a result of this stopping mechanism a sharp blow to the key tip will result in the transfer of force at the contact point. As contact is made at the ruby bearing the energy of the blow will be dissipated through the bearing and into the Perspex and sapphire layers causing possible damage.

Figure 20A:
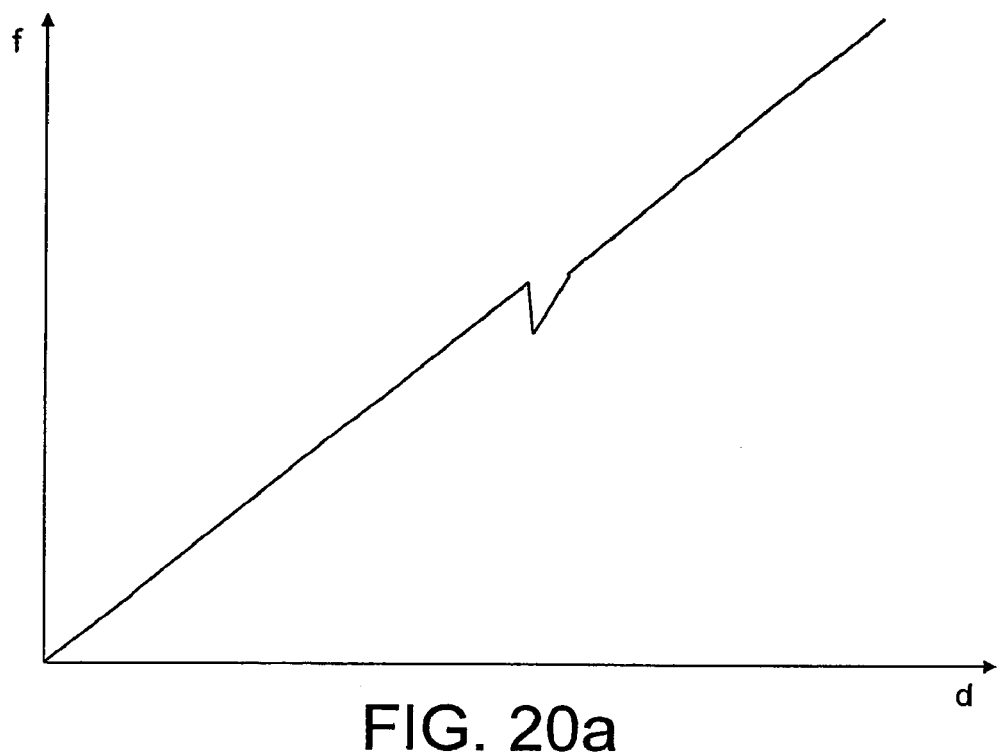
FIGS. 20a and 20b are a graph showing force against distance for a key such as that illustrated in FIGS. 17 and 18, and a conventional key using a dome respectively.
Figure 20B:
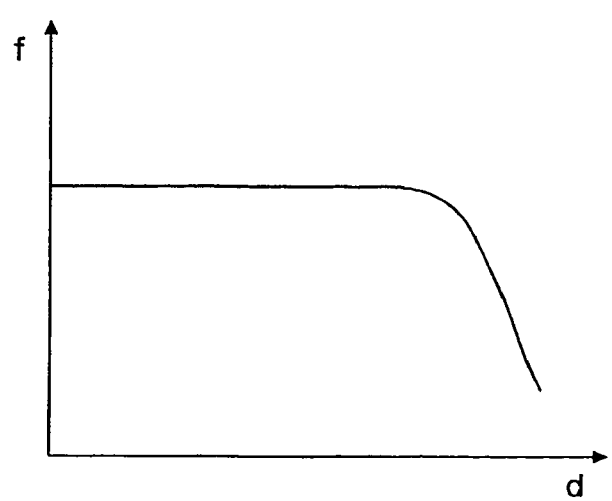

FIG. 20a is a graph illustrating the force against distance profile for a key such as that illustrated in FIGS. 17 and 18. This profile improves the tactility of the key over, for example, a typical keydome arrangement, which had a fairly flat profile as can be seen in FIG. 20b. When using a conventional key dome type arrangement, the user has to apply a constant force until the point where the key actuates. As a result, he does not get a tactile indication that he is nearing the position when actuation is likely to occur. In contrast, when using the device illustrated in FIGS. 17 and 18, the user can realise the fact that he is nearing the position when actuation is likely to occur as he is having to increase the force applied for a given travel of the key. Furthermore, the user is informed when actuation takes place, and again when deactuation takes place, by respective clicking sounds provided by the key.

The central V shaped key tips of the embodiment illustrated in FIG. 1 enable the user to determine the central vertical axis of the device both by sight and by touch. This is made even easier by the pillow 16 being provided with an apex. Consequently the user can quickly locate a desired central key. The apexes of each central key tip also identify the mid point along the length of the key tip, the point from which the key shaft 49 extends. Hence, they facilitate more accurate depression of the key. This, in turn, may assist in the prevention of contact with neighbouring key tips or the need to place keys further apart to prevent such contact.

Likewise, in this embodiment, the combination of adjacent outer key tips and front face protectors forming a V shape enable the user to determine the position of the vertical axes to one side of which the outer keys lie. Consequently, the user can quickly locate a desired outer key. The key location process is facilitated in this embodiment as the outer key tips extend to the interface between the second layer of the composite 51 and the bezel 19.

The front face of the device illustrated in FIG. 1 is protected by the pillow and protectors 63. The protectors help to reduce the effects of unexpected impacts on the front face and the key mechanisms. The front face 3 is slightly concave, with the highest points lying along its central longitudinal axis. Hence, ordinarily, if placed face down, the device would rest on this axis, resulting in scratches to its surface. Clearly, this is not acceptable, particularly when the second layer of composite is sapphire or the like. The device illustrated in FIG. 1 has been designed to avoid this problem. The pillow 16 and face protector 63a prevent the device resting on the second layer of composite. Also, as mentioned above, in the preferred embodiment the key tips protrude slightly from the surface. Hence, the central key tips too may protect the second layer of composite from damage. However, preferably the pillow 16 and chin front face protector 63a are raised sufficiently above the front surface, that the device does not rest on the central key tips either, so as to protect them from damage too.

The device is also designed so that the front face is protected if the edge of the face is knocked. As can be seen from the plan view of the device, depicted in FIG. 21, the bezel front face protectors 63b protrude beyond the surface of the second layer of composite along the interface with the bezel, thereby protecting the second layer of composite from damage in that region. They also reduce the likelihood of damage to the bezel due to knocks. Moreover, they protrude further than the adjacent key tips, hence protecting those key tips from damage too.

One particular benefit of the protectors 63 mentioned above, especially those located on the bezel flanking each row of keys, is that they are dimensioned so as to prevent the keys from reaching their full extent if the handset is accidentally, for example, dropped face downwards. This avoids the possible damage caused if the key trip receives a sharp blow making contact with the ruby bearing as described earlier. The protectors could also be arranged to prevent the keys from being accidentally actuated if, for example, the device was placed face down. That is, the top surface of the front face protector tips could either be at the same level or higher than the top surface of a key tip (e.g. as in the relationship between the protectors 63b and the adjacent outer key tips). In this instance the keys would be untouched or relatively unaffected by being placed or dropped face down on a surface. A protective effect can still be achieved if the protectors 63 are at a lower level than the top surface of a key tip. In the case of a convex front as is the case in some embodiments of the invention, the protectors may be flush with some of the outermost surface of adjacent keys while still being below the surface of more central keys. Under these circumstances, to avoid the ruby bearing being shocked and dissipating energy in an uncontrolled fashion into the front face if dropped, the distance between the top surface of the protector and key tips must be smaller than the distance the key needs to travel in order to reach its contact position i.e. the position when it abuts the ruby bearing. If the key protectors 63 are also going to act to reduce inadvertent actuations, the distance between the top surface of the key tip and the protector should be smaller than the distance the key needs to travel in order for the spring plate contacts to contact the PCB contact region for actuation the key.

The bezel and key/face protectors as a whole channel impact forces through the bezel and into the plastic frame, reducing the chance that such impulses will damage the more fragile regions of the device.

Aspects of the invention have been discussed with reference to a radio telephone function. It will be clear to the skilled man that these aspects apply equally to other portable communications devices supporting in addition or as an alternative other functions, such as, amongst others electronic diaries, and electronic notepads.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

The invention claimed is:

1. An apparatus comprising:
a casing having an operating face;
a plurality of rows of keys, each having an outer face protruding from the plane of the operating face in a rest position and each key being arranged to travel to a contact position located inward of the rest position;
a fragile input region of the operating face, wherein the fragile input region provides recesses for operation of the respective keys; and
a protection arrangement, wherein the protection arrangement comprises a plurality of protectors protruding beyond the fragile input region and one or more elements separate from the fragile input region and connected to the plurality of protectors, and wherein the protection arrangement comprises a respective pair of protectors flanking each row of the plurality of rows of keys, and wherein the protectors have an external profile that provides a plurality of contact points that define a contact plane and wherein when the casing is placed face downwards on a generally planar surface, the fragile input region is spaced from the generally planar surface by the plurality of protectors and impulses received on contact between the generally planar surface and the contact points are substantially dissipated through the protectors and the one or more elements, away from the fragile input region, and wherein the protection arrangement defines the contact plane in the locality of at least one of said keys such that when placed operating face down on a generally flat surface, the resulting travel of said at least one key is restricted.

2. An apparatus according to claim 1, wherein the fragile input region and the protection arrangement are provided by respective casing elements.

3. An apparatus according to claim 1, wherein the fragile input region is formed from a brittle material.

4. An apparatus according to claim 1, wherein the fragile input region comprises a brittle surface layer.

5. An apparatus according to claim 4, wherein the brittle surface layer is disposed on a substrate.

6. An apparatus according to claim 1, wherein the protection arrangement comprises a bezel surrounding the fragile input region.

7. An apparatus according to claim 6, wherein the contact points are provided by face protectors providing the additional function of connecting the bezel to other elements of the casing.

8. An apparatus according to claim 1, wherein the contact points are disposed around the periphery of the operating face.

9. An apparatus according to claim 1, wherein the protection arrangement comprises a projection on the chin of the casing.

10. An apparatus according to claim 1, wherein the protection arrangement comprises a raised portion proximate the earpiece.

11. An apparatus according to claim 1, wherein the contact position is defined by an abutment between the inner face of the key and a bearing surface of the operating face of the handset.

12. An apparatus according to claim 11, wherein the bearing surface is provided by a bearing located in an aperture in the front face of the handset.

13. An apparatus according to claim 12, wherein the bearing is a ruby bearing.

14. An apparatus according to claim 1, comprising at least one key which is a distinct key having a shaft travelling in a direction defined by outer and inner bearings.

15. An apparatus according to claim 1, wherein the contact position is defined by an abutment between the key and the outer bearing surface.

16. An apparatus according to claim 1, wherein each protector has its own one or more elements.

17. An apparatus according to claim 1, wherein the one or more elements is a bezel.

18. An apparatus according to claim 1, wherein the protectors do not touch the fragile input region.

* * * * *